US012680159B2

(12) United States Patent
    Fang et al.

(10) Patent No.:      US 12,680,159 B2
(45) Date of Patent:         Jul. 14, 2026

(54) CHAMBER-ACCUMULATION EXTENSION VIA IN-SITU PASSIVATION

(71) Applicant: Lam Research Corporation, Fremont, CA (US)

(72) Inventors: ZhiYuan Fang, West Linn, OR (US); Changhe Guo, Tigard, OR (US); Chengzhu Qi, Tigard, OR (US); Ruoyu Yue, Beaverton, OR (US); Chunhai Ji, Portland, OR (US)

(73) Assignee: Lam Research Corporation, Fremont, CA (US)

( * ) Notice: Subject to any disclaimer, the term of this patent is extended or adjusted under 35 U.S.C. 154(b) by 184 days.

(21) Appl. No.: 17/619,987

(22) PCT Filed: Jun. 24, 2020

(86) PCT No.: PCT/US2020/039461
    § 371 (c)(1),
    (2) Date: Dec. 16, 2021

(87) PCT Pub. No.: WO2020/264054
    PCT Pub. Date: Dec. 30, 2020

(65) Prior Publication Data
    US 2022/0267900 A1      Aug. 25, 2022

Related U.S. Application Data

(60) Provisional application No. 62/866,996, filed on Jun. 26, 2019.

(51) Int. Cl.
    *C23C 16/44*      (2006.01)
    *C23C 16/40*      (2006.01)
    (Continued)

(52) U.S. Cl.
    CPC ........ *C23C 16/4404* (2013.01); *C23C 16/402* (2013.01); *C23C 16/50* (2013.01); *C23C 16/52* (2013.01)

(58) Field of Classification Search
    CPC ... C23C 16/4404; C23C 16/402; C23C 16/50; C23C 16/52
    See application file for complete search history.

(56) References Cited

U.S. PATENT DOCUMENTS 5,976,900 A  *  11/1999  Qiao ................... C23C 16/4404
                                                    438/14
    6,121,161 A     9/2000  Rossman et al.
                    (Continued)

FOREIGN PATENT DOCUMENTS

CN      106024673      10/2016
    CN      114051541      2/2022
                    (Continued)

OTHER PUBLICATIONS

International Application Serial No. PCT/US2020/039461, International Search Report mailed Oct. 14, 2020, 4 pgs.
International Application Serial No. PCT/US2020/039461, Written Opinion mailed Oct. 14, 2020, 16 pgs.
                    (Continued)

*Primary Examiner* — Kelly M Gambetta
(74) *Attorney, Agent, or Firm* — Schwegman Lundberg & Woessner, P.A.

(57)                ABSTRACT

The disclosed subject matter is a method to reduce film shedding from components internal to a process chamber. In one example, the method includes forming a dielectric film layer on each of a successive plurality of substrates within the process chamber, and, after a pre-determined number of the successive plurality of substrates have had the dielectric film layers formed thereon, forming an undoped-silicate glass (USG) film on the components internal to the process (Continued)

chamber to passivate accumulated levels of the dielectric film layers. Other devices and methods are disclosed.

21 Claims, 14 Drawing Sheets

(51) Int. Cl.
*C23C 16/50* (2006.01)
*C23C 16/52* (2006.01)

(56) References Cited

U.S. PATENT DOCUMENTS

| | | | |
|---|---|---|---|
| 6,815,007 | B1 | 11/2004 | Yoo et al. |
| 2002/0163637 | A1 | 11/2002 | Rossman et al. |
| 2006/0189171 | A1 | 8/2006 | Chua et al. |
| 2015/0147482 | A1* | 5/2015 | Kang ................ C23C 16/45525 |
| | | | 427/535 |
| 2018/0080121 | A1* | 3/2018 | Longrie .................. C23C 16/56 |
| 2018/0114679 | A1 | 4/2018 | Shah et al. |

FOREIGN PATENT DOCUMENTS

| | | | |
|---|---|---|---|
| EP | 0825278 | A1 | 2/1998 |
| JP | 2009526399 | A | 7/2009 |
| KR | 20150060583 | | 6/2015 |
| KR | 20170138954 | | 12/2017 |
| WO | WO-2018112463 | A1 | 6/2018 |

OTHER PUBLICATIONS

"Chinese Application Serial No. 202080047004.9, Office Action mailed Dec. 29, 2023", w Machine English Translation, 32 pgs.

"International Application Serial No. PCT US2020 039461, International Preliminary Report on Patentability mailed Jan. 6, 2022", 8 pages.

"Chinese Application Serial No. 202080047004.9, Response filed May 13, 2024 to Office Action mailed Dec. 29, 2023", English Claims only 6 pgs.

Chinese Application Serial No. 202080047004.9, Office Action mailed Aug. 28, 2024, w/ English Translation, 26 pgs.

"Chinese Application Serial No. 202080047004.9, Decision of Rejection mailed Jan. 26, 2025", W English Translation, 23 pgs.

"Korean Application Serial No. 10-2022-7002761, Notice of Preliminary Rejection mailed Feb. 14, 2025", W English Translation, 27 pgs.

"Chinese Application Serial No. 202080047004.9, Response filed Dec. 30, 2024 to Office Action mailed Aug. 28, 2024", w English claims, 6 pgs.

"Korean Application Serial No. 10-2022-7002761, Response filed Apr. 14, 2025 to Notice of Preliminary Rejection mailed Feb. 14, 2025", W English Claims, 39 pgs.

Chinese Application Serial No. 202080047004.9, Response filed Apr. 27, 2025 to Decision of Rejection mailed Jan. 26, 2025, w/ English Claims, 5 pgs.

"Korean Application Serial No. 10-2022-7002761, Notice of Preliminary Rejection mailed Oct. 29, 2025", W English Translation, 6 pgs.

* cited by examiner

400

410

CHAMBER-ACCUMULATION EXTENSION VIA IN-SITU PASSIVATION

CLAIM OF PRIORITY

This application is a U.S. National Stage Filing under 35 U.S.C. 371 from International Application No. PCT/US2020/039461, filed on Jun. 24, 2020, and published as WO 2020/264054 A1 on Dec. 30, 2020, which claims the priority benefit to U.S. Patent Application Ser. No. 62/866,996, filed on 26 Jun. 2019, and entitled "CHAMBER-ACCUMULATION EXTENSION VIA IN-SITU PASSIVATION," each of which is incorporated by reference herein in its entirety.

TECHNICAL FIELD

The subject matter disclosed herein relates to methods of substrate processing used in the semiconductor and allied industries. More specifically, in various embodiments, the disclosed subject matter relates to a plasma-enhanced chemical vapor deposition TEOS-based chamber-accumulation extension via in-situ passivation of, for example, silane-based films.

BACKGROUND

Fabrication of semiconductor devices often involves depositions of layers of material such as dielectric materials, semiconductor materials, and metal materials. Many of these materials are deposited using chemical vapor deposition (CVD) processes, such as by plasma-enhanced chemical vapor deposition (PECVD) or, in some cases, by atomic-layer deposition (ALD) processes, and other processing techniques known in the art.

In various operations involving a deposition of a common dielectric material, such as silicon dioxide ($SiO_2$), tetraethyl orthosilicate ($Si(OC_2H_5)_4$, also known as tetraethoxysilane or more commonly, TEOS) is frequently used as a precursor to the formation of the resulting $SiO_2$ film. In many process applications, PECVD TEOS is run in a Multiple-Station Sequential-Deposition (MSSD) mode in which batches of substrates (e.g., silicon wafers) are deposited inside the process module. However, once a certain accumulation of dielectric material has been formed on walls and other components within the process chamber, the chamber is subjected to a plasma clean. The plasma clean is needed to reset conditions of the chamber to a baseline state to ensure good repeatability of film properties on substrate, from batch-to-batch.

A limit for an accumulation of films on interior portions of the chamber is determined by various film properties, such as defects, film uniformity values, and other performance indices that appear on the substrates. The defects, film uniformities, and other performance indices present on the substrates are caused by the accumulation of films within the chamber. For example, a typical accumulation limit of TEOS-based films in a PECVD process tool may be approximately 12 µm for films deposited in, for example, a 350° C. to 400° C. process-temperature range.

Various methods have been used in the past to increase a TEOS accumulation limit beyond 12 µm on various types of semiconductor process tools, while still not decreasing performance indices of substrates processed with higher TEOS-accumulation limits. For example, one solution that can push accumulation limits to a 16 µm to 18 µm range is to add temperature-control capability to radio-frequency (RF)- powered, showerheads to produce RF, temperature-controlled (RFTC) showerheads. However, due to the complexity of RFTC showerheads, along with required power box and RF-filtering circuitry to prevent RF-noise interference, a typical RFTC-showerhead upgrade kit can add approximately $150,000 per process chamber. Further, a temperature at which the RFTC-showerhead operates is set to a higher process temperature to produce a more compressive film that is deposited on a face plate of the RFTC shower-head. The more compressive film improves film adhesion to the showerhead and extends chamber accumulation limits. Without improved adhesion of the film, the RFTC shower-head may shed particles onto a substrate, increasing the number of particle defects (defect adders) on the substrate and decreasing the performance of electronic devices produced on at least the areas of the substrate in which the particle defects are present. Regardless, an overall device yield is affected adversely.

Moreover, running the RFTC showerhead at a higher temperature also accelerates the growth of, for example, aluminum fluoride ($AlF_3$), causes faster process shifts in the substrate processing, and results in a shortened lifetime of parts and components within a process tool.

The background description provided here is for the purpose of generally presenting the context of the disclosure. Work of the presently named inventors, to the extent that it is described in this background section, as well as aspects of the description that may not otherwise qualify as prior art at the time of filing, are neither expressly nor impliedly admitted as prior art against the present disclosure. Consequently, the information described in this section is provided to offer the skilled artisan a context for the following disclosed subject matter and should not be considered as admitted prior art.

SUMMARY

In some exemplary embodiments of the disclosed subject matter, a method to reduce film shedding from components internal to a process chamber is disclosed. The method includes forming a dielectric film layer on each of a successive plurality of substrates within the process chamber. After a pre-determined number of the successive plurality of substrates have had the dielectric film layers formed thereon, forming an undoped-silicate glass (USG) film on the components internal to the process chamber to passivate accumulated levels of the dielectric film layers.

In some exemplary embodiments of the disclosed subject matter, a method for passivating accumulated films in a process chamber is disclosed. The method includes forming a dielectric layer on a substrate and making a determination as to whether a pre-determined number of substrates to be processed has been reached. Based on a determination that the pre-determined limit has not been reached, processing an additional substrate. Based on a determination that the pre-determined limit has been reached, passivating the accumulated films on internal components of the process chamber.

In some exemplary embodiments of the disclosed subject matter, a tangible computer-readable medium having no transitory signals and containing instructions is disclosed. The instructions, when executed by one or more hardware-based processors of a machine, cause the machine to perform operations including forming a dielectric layer on a substrate and making a determination as to whether a pre-determined number of substrates to be processed has been reached. Based on a determination that the pre-determined limit has not been reached, processing an additional substrate. Based on a determination that the pre-determined limit has been reached, passivating the accumulated films on internal components of the process chamber.

In some exemplary embodiments of the disclosed subject matter, a method to reduce film shedding from components internal to a process chamber is disclosed. The method includes forming a dielectric film layer on each of a successive plurality of substrates within the process chamber and making a determination as to whether a pre-determined cumulative accumulation value of the dielectric film layer on each of the successive plurality of substrates has at least been reached. Based on a determination that the pre-determined cumulative accumulation value has not been reached, processing an additional substrate. Based on a determination that the pre-determined the pre-determined cumulative accumulation value has at least been reached, passivating the accumulated films on internal components of the process chamber.

In some exemplary embodiments of the disclosed subject matter, a tangible computer-readable medium having no transitory signals and containing instructions is disclosed. The instructions, when executed by one or more hardware-based processors of a machine, cause the machine to perform operations including forming a dielectric film layer on each of a successive plurality of substrates within the process chamber and making a determination as to whether a pre-determined cumulative accumulation value of the dielectric film layer on each of the successive plurality of substrates has at least been reached. Based on a determination that the pre-determined cumulative accumulation value has not been reached, processing an additional substrate. Based on a determination that the pre-determined the pre-determined cumulative accumulation value has at least been reached, passivating the accumulated films on internal components of the process chamber.

DETAILED DESCRIPTION

Figure 1:
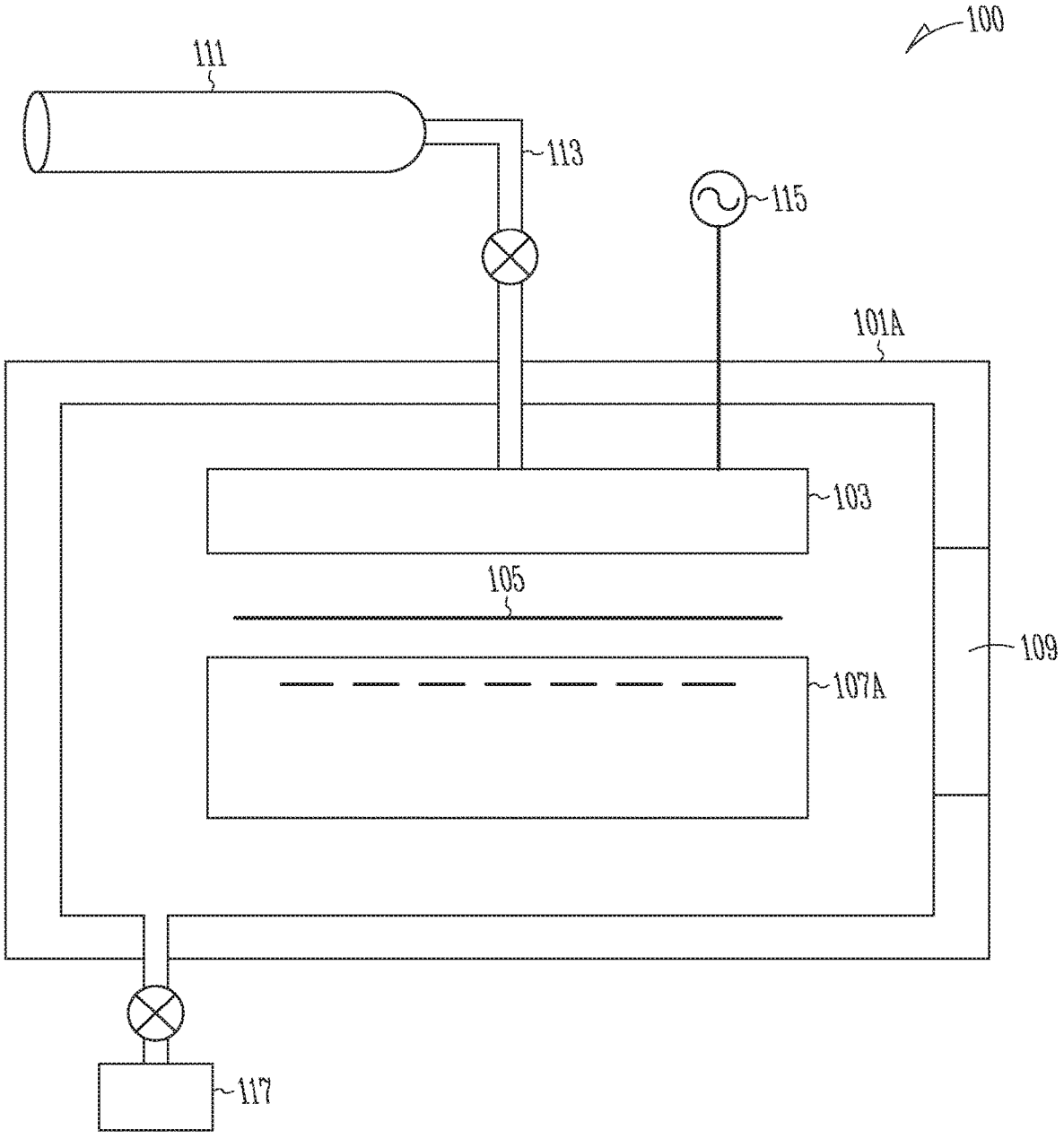
FIG. 1 shows a simplified example of a plasma-based-processing fabrication-tool that may be used with various exemplary embodiments of the disclosed subject matter.

The disclosed subject matter will now be described in detail with reference to a few general and specific embodiments as illustrated in various ones of the accompanying drawings. In the following description, numerous specific details are set forth in order to provide a thorough understanding of the disclosed subject matter. It will be apparent, however, to one skilled in the art, that the disclosed subject matter may be practiced without some or all of these specific details. In other instances, well-known process steps, fabrication techniques, or structures have not been described in detail so as not to obscure the disclosed subject matter. As used herein, the terms "about" or "approximately" may refer to values that are, for example, within ±10% of a given value or range of values.

As noted above, the manufacture of semiconductor devices typically involves depositing one or more thin films on a substrate in an integrated-fabrication process. In some aspects of the integrated-fabrication process, various types of thin films can be deposited using atomic layer deposition (ALD), chemical vapor deposition (CVD), plasma-enhanced chemical vapor deposition (PECVD), or any other suitable deposition methods and techniques as described above.

To increase productivity of process tools, as well as maintain or increase yields of electronic devices made by those process tools, it is desirable to increase TEOS-based film-accumulation limits within the process chamber without resorting to expensive hardware upgrades and the accompanying negative impact to a lifetime of the process tool components. Further, it is desirable to reduce the number of plasma-based chamber cleans needed to reduce or eliminate film build-ups on the showerhead and other interior process-chamber components.

Since film adhesion to a showerhead face plate is one factor in determining an accumulation limit, the disclosed subject matter is directed to identifying passivation layers that are deposited in between selected ones of the sequentially-deposited TEOS-based films, thereby creating a multi-layer structure that adheres well to the showerhead and layers already deposited thereon. Additionally, although the disclosed subject matter presented herein is described in terms of PECVD TEOS-accumulation extension limits, the same processes and techniques may be applicable to other types of process tools and films.

The disclosed subject matter therefore increases the 12 μm accumulation limit of the prior art discussed above via an innovative process solution to boost system throughput and competitiveness of various types of deposition process tools.

For example, data collected has proved the effectiveness of silane ($SiH_4$)-based, undoped-silicate glass (USG) films that are periodically inserted during TEOS depositions. The USG effectively provides passivation, or a barrier or encapsulation layer, that reduces or eliminates particles from shedding off of a process-tool showerhead and other internal process-chamber components. The USG effectively passivates (e.g., encapsulates) the TEOS deposited on the showerhead and other components internal to the process chamber and prevents the TEOS from shedding or flaking off of the showerhead onto process substrates. The periodic insertion of the $SiH_4$-based USG films has demonstrated a significant accumulation limit extension of 9 μm or more over baseline conditions.

In general, and as described in more detail below, undoped-silicate glass has a high-deposition rate at low temperatures. USG has properties similar to $SiO_2$. USG is easy to deposit via, for example, plasma enhanced CVD, high-density plasma CVD (HDP-CVD) or sub-atmospheric CVD (SACVD) as well as other processes. Further, USG is commonly used as an insulator and passivation layer in multilevel inter-metal dielectric (IMD) layer applications. The use of USC is described in more detail below.

With reference now to FIG. 1, a simplified example of a plasma-based-processing fabrication-tool 100 is shown. FIG. 1 is shown to include the plasma-based processing chamber 101A in which a showerhead 103, which may include an electrode, and a substrate-support assembly 107A are disposed. Typically, the substrate-support assembly 107A provides a substantially-isothermal surface and may serve as both a heating element and a heat sink for a substrate 105. The substrate-support assembly 107A may comprise an electrostatic chuck (ESC) in which heating elements are included to aid in processing the substrate 105, as described above. As understood by a person of ordinary skill in the art, the substrate 105 may a wafer comprising elemental semiconductors (e.g., silicon or germanium), a wafer comprising compound elements (e.g., gallium arsenide (GaAs) or gallium nitride (GaN)), or variety of other substrate types known in the art (including conductive, semiconductive, and non-conductive substrates).

In operation, the substrate 105 is loaded through a loading port 109 onto the substrate-support assembly 107A. A gas line 113 supplies one or more process gases to the showerhead 103. In turn, the showerhead 103 delivers the one or more process gases into the plasma-based processing chamber 101A. A gas source 111 to supply the one or more process gases is coupled to the gas line 113. An RF power source 115 is coupled to the showerhead 103.

In operation, the plasma-based processing chamber 101A is evacuated by a vacuum pump 117. RF power is capacitively coupled between the showerhead 103 and a lower electrode (not shown explicitly) contained within or on the substrate-support assembly 107A. The substrate-support assembly 107A is typically supplied with two or more RF frequencies. For example, in various embodiments, the RF frequencies may be selected from at least one frequency at about 1 MHz, 2 MHz, 13.56 MHz, 27 MHz, 60 MHz, and other frequencies as desired. However, upon reading and understanding the disclosure provided herein, the person of ordinary skill in the art will recognize that a coil required to block or partially block a particular RF frequency can be designed as needed. Therefore, particular frequencies discussed herein are provided merely for ease in understanding. The RIF power is used to energize the one or more process gases into a plasma in the space between the substrate 105 and the showerhead 103. As is known in the relevant art, the plasma can assist in depositing various layers (not shown) on the substrate 105. In other applications, the plasma can be used to etch device features into the various layers on the substrate 105. As noted above, the substrate-support assembly 107A may have heaters (not shown) incorporated therein. The person of ordinary skill in the art will recognize that, while the detailed design of the plasma-based processing chamber 101A may vary, RF power is coupled through at least the substrate-support assembly 107A.

A controller (not shown in FIG. 1 but described in more detail with reference to FIG. 7, below) may contain instructions for controlling parameters for the operation of the plasma-based-processing fabrication-tool 100. In various embodiments, the controller will typically include one or more memory devices and one or more processors. The processor may include a central-processing unit (CPU), a microprocessor, or computer; analog and/or digital input/output connections; stepper-motor controller boards; and other connections and peripheral devices known in the art.

The controller may contain instructions for controlling process conditions and operations (e.g., a process recipe) in accordance with various embodiments of the disclosed subject matter for the plasma-based-processing fabrication-tool 100. In some embodiments, the controller controls all of activities of the plasma-based-processing fabrication-tool 100. As described below with reference to FIG. 7, the controller may execute system control software stored in a mass-storage device, loaded into a memory device, and executed on a processor. The system-control software may include instructions for controlling the timing, mixture of gases, chamber and/or station pressures, chamber and/or station temperatures, purge conditions and timing, substrate temperatures, RF-power levels, and RF frequencies. The system-control software may also control substrate, pedestal, chuck and/or susceptor positions, and other parameters of a particular process that is performed by the process tool. The system-control software may be configured in any suitable way. For example, various process tool component subroutines or control objects may be written to control operations of the process tool components necessary to carry out various process tool processes in accordance with the disclosed methods. The system control software may be coded in any suitable computer-readable programming-language.

Figure 2A:
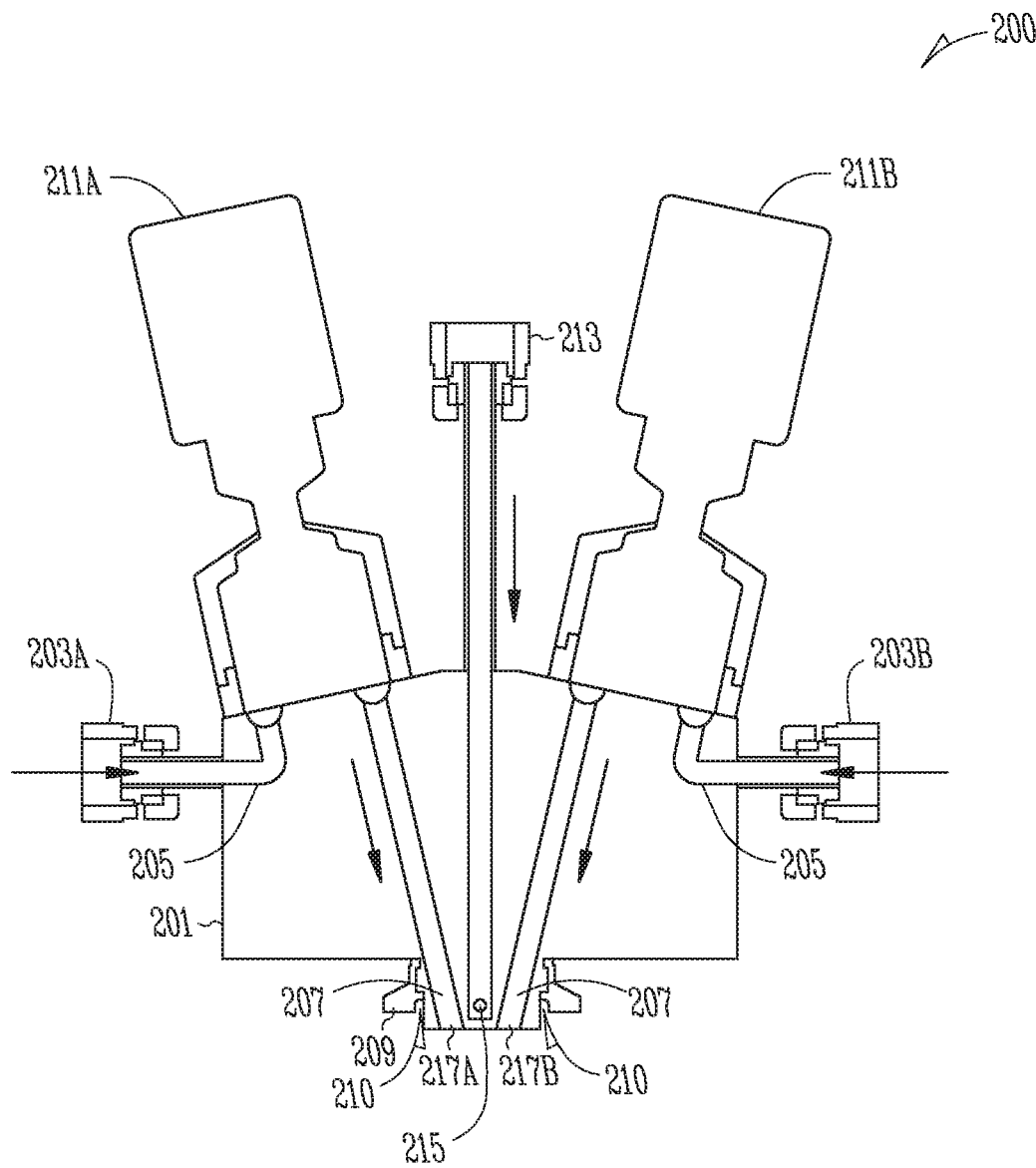
FIG. 2A shows a cross-sectional view of an example of a point-of-use (POU) valve and manifold combination that may be used with various exemplary embodiments of the disclosed subject matter.

Referring now to FIG. 2A, a cross-sectional view of an example of a point-of-use (POU) valve and manifold combination 200 in accordance with various embodiments of the disclosed subject matter is shown. The POU valve and manifold combination 200 may have a plurality of precursor gas inlets, each controlled by at least one valve, and a purge gas inlet. Each precursor uses at least one dedicated POU valve and has a dedicated flow path separate from flow paths for other precursor gases, thereby reducing or eliminating the possibility for any precursor gases to be mixed within flow paths within the manifold.

For example, as is known to a person of ordinary skill in the art, the mixing of particular gases may be detrimental to human safety or machine safety and operation, either in a single tool or tool-to-tool. In one specific example, the person of ordinary skill in the art knows that silane ($SiH_4$) is an inorganic colorless gaseous compound of silicon and hydrogen that has strong reducing properties and is spontaneously flammable in air. Consequently, if mixed, oxygen and silane can potentially explode or ignite. The POU valve and manifold combination 200 prevents or reduces the possibility of such gases being mixed. Therefore, the POU valve and manifold combination 200 provides a particularly advantageous hardware-based safety feature in combination with various embodiments described herein. However, the skilled artisan will also recognize that the various embodiments may be performed without the POU valve and manifold combination 200. For example, the system-control software described above and in more detail with reference to FIG. 7 below, can be programmed to provide appropriate lookup tables and interrupts to prevent certain gases from being combined.

With continuing reference to FIG. 2A, the POU valve and manifold combination 200 may be used with the showerhead 103 of FIG. 1. FIG. 2A is shown to include a manifold block 201 onto which two valves are coupled. A first POU valve 211A is coupled to a first inlet flow path 205 (left side of FIG. 2A) from a first connector 203A, and a first outlet flow path 207 on the left side of FIG. 2A. A second POU valve 2111B is coupled to a second inlet flow path 205 (right side of FIG. 2A) from a second connector 203B, and a second outlet flow path 207 on the right side of FIG. 2A. Arrows on FIG. 2A indicate a direction of gas flow through the POU valve and manifold combination 200.

The manifold block 201 may be formed from, for example, stainless steel (e.g., a 316L alloy), aluminum (Al), aluminum oxide ($Al_2O_3$), or a number of other materials known in the art. One or more other types of materials may also be used to form the manifold block 201 provided the one or more materials are compatible with the precursor gases being used in the ALD process. For example, when depositing an aluminum oxide dielectric layer onto a substrate (e.g., using as one of the precursor gases, trimethyl-aluminum (TMA)), the manifold block 201 may be formed from aluminum oxide since the coefficient of thermal expansion (CTE) of the manifold block 201 and the precursor gas is nearly identical. Therefore, if any particles of $Al_2O_3$ are formed within flow paths of the manifold block 201, the particles will not flake off since the CTE of the two materials is substantially the same, thereby preventing an expansion or contraction of one material without also expanding or contracting the other material by substantially the same amount.

The first POU valve 211A and the second POU valve 211B are known in the industry but may be, for example, a Fujikin® online controller valve (available from Fujikin® of America, Fremont, California, USA). Other valves are known to a skilled artisan.

In a specific exemplary embodiment, the first POU valve 211A and the second POU valve 211B are four-way valves, each having two input connections and two output connections. In this embodiment, the two input connections of the four-way valve may be coupled to, for example, a precursor gas ampule (described above with reference to FIG. 1) and an ultra-pure purge-gas supply (e.g., argon, Ar, or nitrogen, $N_2$). For example, the first connector 203A may be coupled to one of the two input connections to the four-way valve. The two output connections of the four-way valve are coupled to, for example, to respective ones of the outlet-flow paths 207 (delivering the precursor gas to the showerhead and/or processing chamber) or to a second valve (not shown in FIG. 2A but described with reference to FIG. 2B, below). The second valve is a divert valve used to redirect the precursor gas to a flow path (not shown) directed away from (outside of) the processing chamber.

The first connector 203A and the second connector 203B may be various types of connector known in the industry to a skilled artisan that may be used to connect the POU valve and manifold combination 200 to precursor gas supplies (not shown). For example, the first connector 203A and the second connector 203B may be a Swagelok® tube fitting (available from Swagelok Company, Solon, Ohio, USA), a Parker Hannifin tube fitting (available from Parker Hannifin Corporation, Fluid System Connectors Division Otsego, Michigan, USA), or other types of connectors known to the person of ordinary skill in the art.

The precursor gases delivered through the first outlet flow path 207 (left side) and the second outlet flow path 207 (right side) exit through a left-side exit port 217A and a right-side exit port 217B. In a specific exemplary embodiment, the left-side exit port 217A and the right-side exit port 217B are positioned within a specialized flange, commonly known in the semiconductor industry as a Klein Flansche (KF) vacuum-flange outlet 209 (also known as a Quick Flange (QF)). The KF designation is recognized internationally by ISO, DIN, and other standards-setting organizations. The KF vacuum-flange outlet 209 frequently connects to a ceramic tee (not shown but known in the industry), which in turn connects the KF vacuum-flange outlet 209, on a first side of the ceramic tee, to the showerhead 103 (see FIG. 1), on a second side of the ceramic tee. As is known to the skilled artisan, the ceramic tee may also be connected to a purge-gas line on the third side of the ceramic tee to purge the showerhead 103.

In some embodiments, the KF vacuum-flange outlet 209 may be permanently attached to the manifold block 201. In other embodiments, the KF vacuum-flange outlet 209 may be separately attached to the manifold block 201 as a replaceable component attached by, for example, a threaded connection or bolted connections from the KF vacuum-flange outlet 209 to the manifold block 201. An inner portion of the KF vacuum-flange outlet 209 and peripheral to the left-side exit port 217A and the right-side exit port 217B, form an annulus 210 (shown and described in more detail with regard to FIG. 2C, below).

The POU valve and manifold combination 200 includes a purge-connection inlet 213 to be coupled to and receive a purge gas (e.g., Ar or $N_2$) from a high-purity purge-gas supply (not shown). The purge gas exits through a purge-gas outlet port 215 (only one port is shown but the skilled artisan will recognize that multiple outlet ports may be used). The purge-gas outlet port 215 is used to purge the annulus 210. As shown and described in more detail below with reference to FIG. 2C, the purge-gas outlet port 215 is directed substantially toward interior walls of the annulus 210 to more efficiently purge the annulus 210. The annulus 210 is the first portion external to the POU valve and manifold combination 200 where the precursor gases may combine. The purge-gas outlet port 215 helps to reduce or eliminate any possible mixing, and a subsequent deposition, of the precursor gases that may occur once the precursor gases exit through the left-side exit port 217A and the right-side exit port 2171B. The purge-gas outlet port 215 thus reduces or eliminates the chances of deposited layers flaking, thereby otherwise possibly necessitating replacement of the POU valve and manifold combination 200.

Figure 2B:
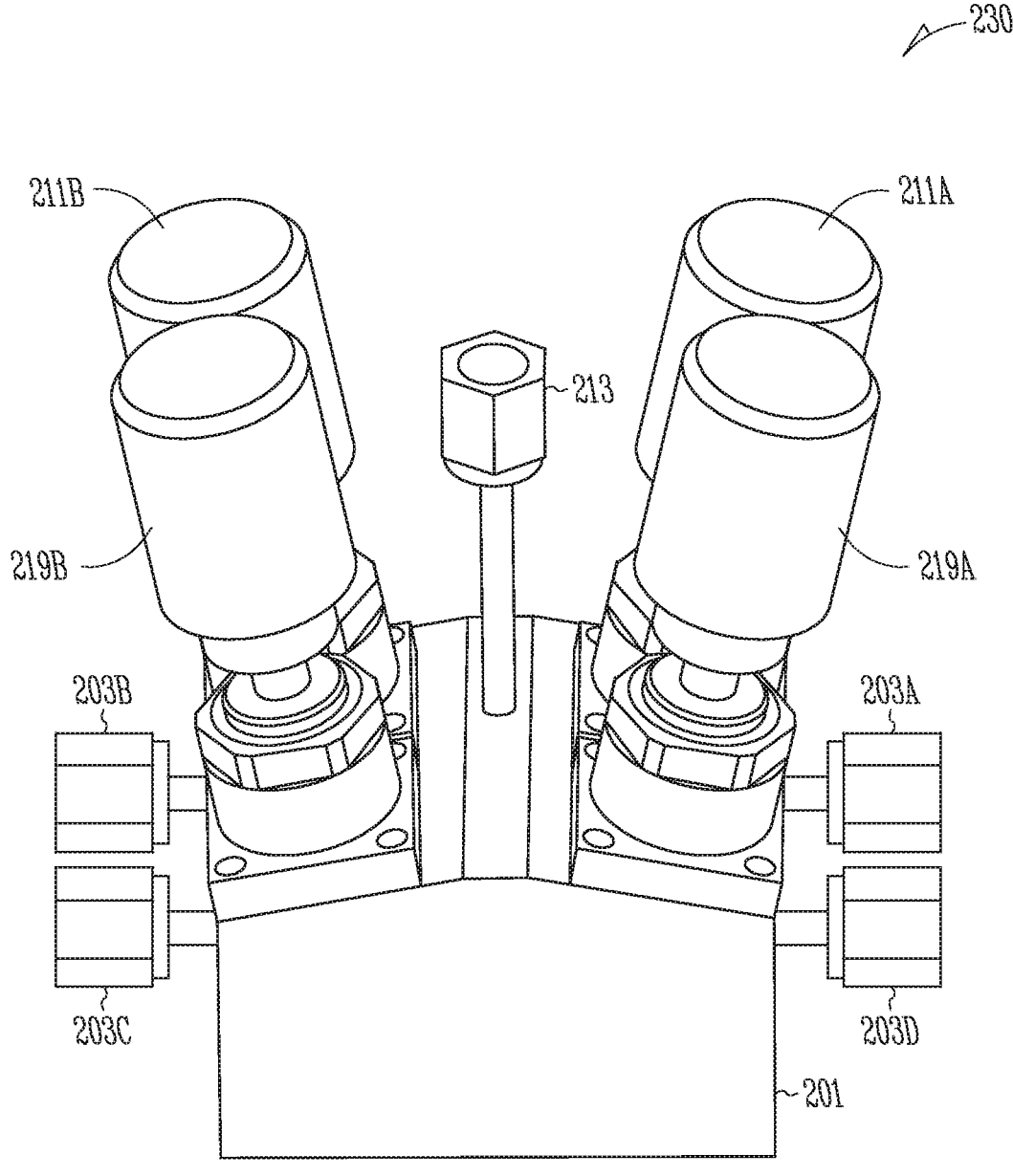
FIG. 2B shows a three-dimensional (3D) representation of an example of the point-of-use (POU) valve and manifold combination of FIG. 2A, as shown from the opposite side of FIG. 2A.

With reference now to FIG. 2B, a three-dimensional (3D) representation 230 of an example of the POU valve and manifold combination 200 of FIG. 2A, is shown from the opposite side of FIG. 2A. The 3D representation 230 includes a first divert-valve 219A and a second divert-valve 219B. The first divert-valve 219A is coupled internally (e.g., within the manifold block 201) to a first divert connection-port 203D. The second divert-valve 219B is coupled internally (e.g., within the manifold block 201) to a second divert connection-port 203C.

In a specific exemplary embodiment, the first divert-valve 219A and the second divert-valve 219B may any of a variety of two-way valves as known in the art and described above with reference to FIG. 2A. The first divert connection-port 203D and the second divert connection-port 203C may include any of a variety of connectors known in the art, such as the Swagelok® or the Parker-Hannifin connectors described above with reference to FIG. 2A.

The first divert connection-port 203D and the second divert connection-port 203C may be coupled to, for example, a facility vacuum (abatement) or pump to redirect the precursor gases away from the processing chamber. For example, during an operation of an ALD process chamber, the first POU valve 211A and the second POU valve 2111B are generally set to a divert position, until the precursor gases are needed in the process chamber. The divert position couples the precursor gases from the first POU valve 211A and the second POU valve 211B to the first divert-valve 219A and the second divert-valve 219B, respectively, to evacuate the precursor gases to the pump or the facility vacuum, until the precursor gases are needed, sequentially during the ALD operation, in the process chamber. Thus, as is known to the skilled artisan, precursor gases should always be flowing due to the critical timing (e.g., fractional seconds as low as nanoseconds) required for flowing the precursor gases into the process chamber. Since precursor gas ampules (see, e.g., the gas source 111 of FIG. 1) are often located a distance from the process chamber (e.g., three meters or more), merely opening and closing the first POU valve 211A and the second POU valve 211B would not provide a sufficiently fast operational time to provide the precursor gases into the process chamber.

Figure 2C:
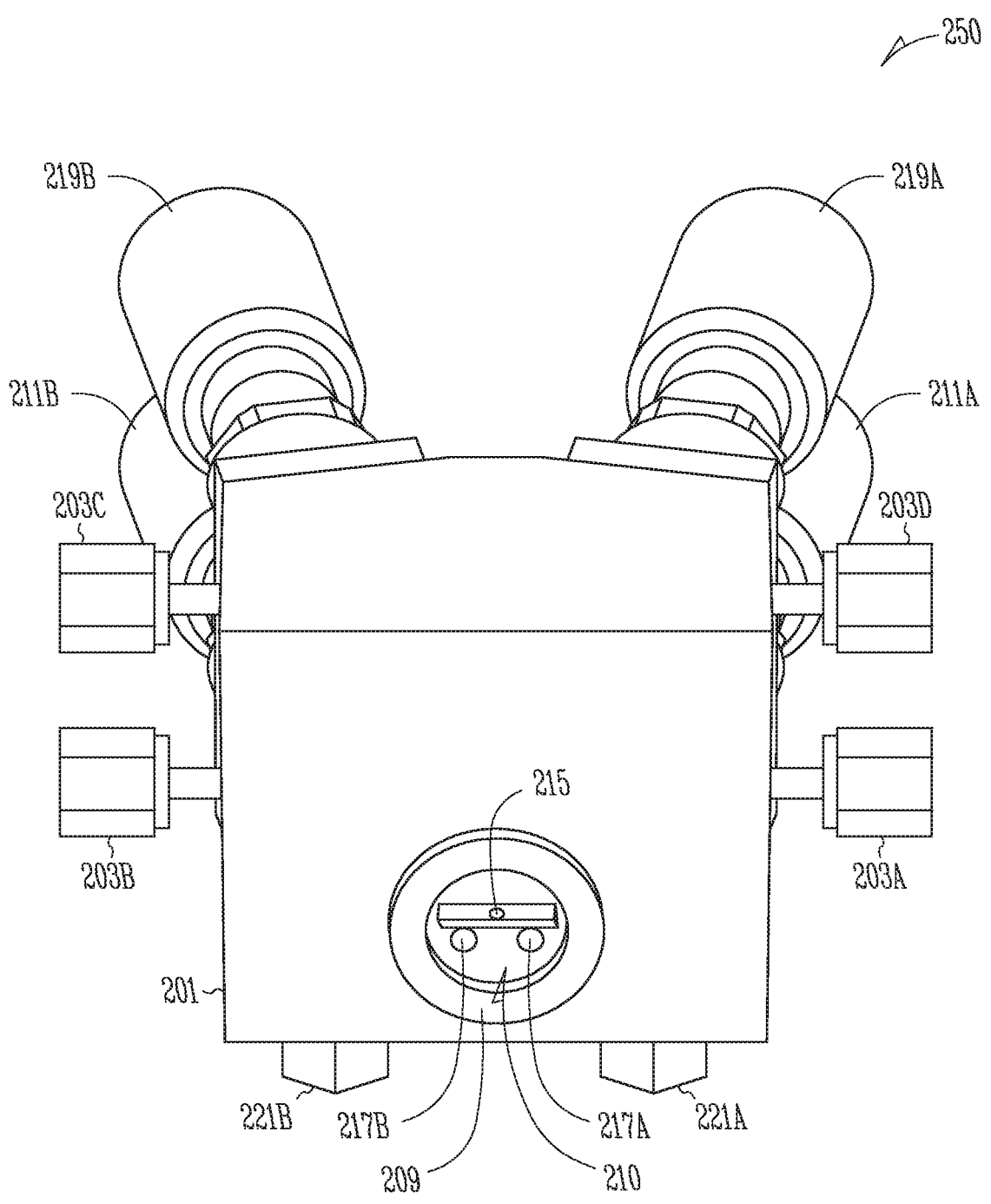
FIG. 2C shows a three-dimensional (3D) representation of an example of the point-of-use (POU) valve and manifold combination of FIG. 2A and FIG. 2B, as shown from a bottom view of FIG. 2B.

FIG. 2C shows a three-dimensional (3D) representation 250 of an example of the point-of-use (POU) valve and manifold combination of FIG. 2A and FIG. 2B, as shown from a bottom view of FIG. 2B. The 3D representation 250 of FIG. 2C indicates a more detailed view of the KF vacuum-flange outlet 209, the annulus 210, and the left-side exit port 217A and the right-side exit port 217B. The 3D representation 250 indicates how the purge-gas outlet port 215 is used to purge the annulus 210 by supplying a purge gas from the purge-connection inlet 213 (see FIGS. 2A and 2B) to reduce or eliminate any precursor gases from the annulus 210 that were supplied from the left-side exit port 217A and the right-side exit port 217B.

Overall, the disclosed POU valve has a number of advantages over contemporaneous off-the-shelf POU valves and manifolds used for delivery of precursor gases into a process chamber. As described herein, the disclosed POU valve uses one or more separate valves and separate flow paths for each of the precursor gases, thereby reducing or eliminating deposits (formed from the precursor gases mixing) at an internal body of the valve or manifold. Further, as described above, the disclosed POU valve provides particular safety features.

A number of tests were performed to confirm effectiveness as the disclosed subject matter. For example, Table I below shows a number of deposition process steps and a typical deposition rate for a deposited TEOS-based film at a given time. For the tests conducted to produce Table I, no USG depositions were performed in order to provide baseline data. In this example, a deposition rate of 6200 Å per minute for 97.13 seconds produces a film thickness on the substrate of 10,037 Å. A running total of chamber accumulation shows a total thickness of TEOS film accumulated on one or more interior portions (e.g., the showerhead) after a given process step. For example, after TEOS deposition B4, a total of 57,695 Å (approximately 5.7 μm) of TEOS-based film has accumulated within the chamber. Consequently, after TEOS deposition B8, a total TEOS film thickness accumulated within the chamber is about 97,843 Å.

With continuing reference to Table I, at several points during the deposition process steps, substrates having the deposited TEOS-based films were scanned for defects (e.g., particle adders or defect adders). The substrates were scanned on, for example, a Surfscan® SP7 unpatterned wafer defect inspection system (available from KLA Corporation. One Technology Drive, Milpitas, Calif., USA). In one embodiment, a 100-adder limit (e.g., an added number of detected particles or defects), as measured at a sensitivity of greater than or equal to 0.09 μm, served as a pass/no-pass threshold limit. For example, 14 defects were added by the end of the third process-step (after TEOS deposition B2). Another 12 defects were added after the fifth process-step was completed (after TEOS deposition B4) and another 97 defects were added after the seventh process-step. Therefore, until the end of the fifth process-step, the total number of defect adders was within the 100-adder limit. However, 998 defects were added by the end of the ninth and final process-step (after TEOS deposition 118). Consequently, the maximum number of process steps that can be performed without exceeding the predetermined 100-adder limit is less than nine process-steps. (In Tables I and II. "NM" indicates that the substrates were not measured.)

TABLE I

| PROCESS STEPS | DEP RATE [Å/MIN] | TIME [SEC] | THICKNESS [Å] | CHAMBER ACCUMULATION [Å] | DEFECT ADDERS |
|---|---|---|---|---|---|
| TEOS PRECOAT | 5849 | 180 | 17547 | 17547 | N/A |
| TEOS DEP B1 | 6200 | 97.13 | 10037 | 27584 | NM |
| TEOS DEP B2 | 6200 | 97.13 | 10037 | 37621 | 14 |
| TEOS DEP B3 | 6200 | 97.13 | 10037 | 47658 | NM |
| TEOS DEP B4 | 6200 | 97.13 | 10037 | 57695 | 12 |
| TEOS DEP B5 | 6200 | 97.13 | 10037 | 67732 | NM |
| TEOS DEP B6 | 6200 | 97.13 | 10037 | 77769 | 97 |
| TEOS DEP B7 | 6200 | 97.13 | 10037 | 87806 | NM |
| TEOS DEP B8 | 6200 | 97.13 | 10037 | 97843 | 998 |

Table II provides a summary of the results of the baseline data test used to produce the results indicated in Table I. Table II shows the number of defect adders (at greater than or equal to 0.09 μm sensitivity level) and the TEOS-based film thickness accumulation level (in units of Angstroms [Å]).

TABLE II

| CHAMBER ACCUMULATION [Å] | 37621 | 57695 | 77769 | 97843 |
|---|---|---|---|---|
| DEFECT ADDERS [AT ≥0.09 μm] | 14 | 12 | 97 | 998 |

Referring now to Table III, a number of tests were performed to confirm effectiveness as the disclosed subject matter. For example, Table III below shows a number of deposition process steps and a typical deposition rate for a deposited TEOS-based film at a given time. However, the test performed to produce the results of Table III includes a single USG-precoat deposition, performed as the sixth process-step (after the TEOS deposition B4). The single USG-precoat deposition was deposited at a rate of 2919 Å per minute, producing a USG passivation-layer having a thickness of about 20,000 Å.

as discussed above) to the total process time. However, the several additional minutes for the USG deposition time prevented a complete plasma-clean cycle to reset conditions of the chamber to a baseline state to ensure good repeatability of film properties on substrate, from batch-to-batch. The plasma-clean cycle would be much more time intensive than the USG dependent time.

Table IV, below, provides a summary of the results of the baseline data test used to produce the results indicated in Table III. Table IV shows the number of defect adders (at greater than or equal to 0.09 μm sensitivity level) and the TEOS film thickness accumulation level (in units of Å).

TABLE III

| PROCESS STEPS | DEP RATE [Å/MIN] | TIME [SEC] | THICKNESS [Å] | CHAMBER ACCUMULATION [Å] | DEFECT ADDERS |
|---|---|---|---|---|---|
| TEOS PRECOAT | 5849 | 180 | 17547 | 17547 | N/A |
| TEOS DEP B1 | 6200 | 97.13 | 10037 | 27584 | 28 |
| TEOS DEP B2 | 6200 | 97.13 | 10037 | 37621 | 17 |
| TEOS DEP B3 | 6200 | 97.13 | 10037 | 47658 | 6 |
| TEOS DEP B4 | 6200 | 97.13 | 10037 | 57695 | 32 |
| USG PRECOAT | 2919 | 415 | 20190 | 77885 | N/A |
| TEOS DEP B5 | 6200 | 97.13 | 10037 | 87922 | 88 |
| TEOS DEP B6 | 6200 | 97.13 | 10037 | 97959 | 41 |
| TEOS DEP B7 | 6200 | 97.13 | 10037 | 107996 | 18 |
| TEOS DEP B8 | 6200 | 97.13 | 10037 | 118033 | 8 |
| TEOS DEP B9 | 6200 | 97.13 | 10037 | 128070 | 35 |
| TEOS DEP B10 | 6200 | 97.13 | 10037 | 138107 | 92 |
| TEOS DEP B11 | 6200 | 97.13 | 10037 | 148144 | 232 |
| TEOS DEP B12 | 6201 | 97.13 | 10038 | 158182 | 635 |

TABLE IV

| CHAMBER ACCUMULATION [Å] | 27584 | 37621 | 47658 | 57695 |
|---|---|---|---|---|
| DEFECT ADDERS [AT ≥0.09 μm] | 28 | 17 | 6 | 32 |
| CHAMBER ACCUMULATION [Å] | 87922 | 97959 | 107996 | 118033 |
| DEFECT ADDERS [AT ≥0.09 μm] | 88 | 41 | 18 | 8 |
| CHAMBER ACCUMULATION [Å] | 128070 | 138107 | 148144 | 158182 |
| DEFECT ADDERS [AT ≥0.09 μm] | 35 | 92 | 232 | 635 |

As noted in this example related to Table III, a total of 11 TEOS depositions (TEOS deposition B1 through TEOS deposition B11) were performed before the number of defect adders exceeded the pass/no-pass threshold of 100 adders. Consequently, even though over 138,000 Å of TEOS-based film thickness was accumulated with the process chamber (after TEOS deposition B10), the total number of defect adders after TEOS DEP B10 was only 92. In comparison with no USG deposition step as noted above with reference to Table I and Table II, only about 78,000 Å of chamber accumulation occurred (with a corresponding defect adder count of 97).

Therefore, the added USG deposition process-step used to produce the results of Table III has resulted in an increased accumulation limit, from 78,000 Å and six TEOS deposition steps with no USG deposition, to over 138,000 Å with ten TEOS deposition steps and a single USG deposition to form the passivation-layer of approximately 20,000 Å.

The USG deposition did add several additional minutes (415 seconds (less than 7 minutes) plus a possible purge time Based on the favorable results of a single USG-deposition process-step, Table V, below, shows a number of deposition process steps and a typical deposition rate for a deposited TEOS film at a given time. The test performed to produce the results of Table V includes three separate. USG-precoat depositions, performed as the sixth process-step (after the TEOS deposition B4), the eleventh process-step (after the TEOS deposition B8), and the sixteenth process-step (after the TEOS deposition B12). Each of the three USG-precoat deposition was deposited at a rate of 2919 Å per minute, each producing a USG passivation-layer having a thickness of about 20,000 Å.

As noted in this example related to Table V, a total of 16 TEOS depositions (TEOS deposition B1 through TEOS deposition B16) were performed before the number of defect adders exceeded the pass/no-pass threshold of 100 adders. The defect scan revealed 169 defect adders after TEOS deposition B16. Consequently, even though nearly 239,000 Å of TEOS film thickness was accumulated with the process chamber (after TEOS deposition B16), the total number of defect adders after TEOS DEP B15 was only 99. In comparison with the single USG-deposition as noted above with reference to Table III and Table IV, nearly 239.000 Å of chamber accumulation occurred (with a corresponding defect adder count of 99).

Therefore, the added USG-deposition process-steps used to produce the results of Table V has resulted in an increased accumulation limit, from 78,000 Å and six TEOS deposition steps with no USG deposition (as noted in Tables I and II), and over 138,000 Å with ten TEOS deposition steps and a single USG deposition to form the passivation-layer of approximately 20.000 Å (as noted in Tables III and IV), to now over 239.000 Å with 15 TEOS deposition steps and three, separate USG depositions to form the three passivation-layers of approximately 20,000 Å each (as noted in Tables V and VI).

As noted above, each of the USG depositions did add several additional minutes (415 seconds (less than 7 minutes, plus a possible purge time as discussed above) to the total process time. However, the several additional minutes for each of the USG-deposition times prevented a complete plasma-clean cycle to reset conditions of the chamber to a baseline state to ensure good repeatability of film properties on substrate, from batch-to-batch. Further as noted above, the complete plasma-clean cycle is much more time intensive than the added USG process steps.

Table VI, below, provides a summary of the results of the baseline data test used to produce the results indicated in Table V. Table VI shows the number of defect adders (at greater than or equal to 0.09 μm sensitivity level) and the TEOS-based film thickness accumulation level (in units of Å). (In Tables V and VI, "NM" indicates that the substrates were not measured.)

TABLE V

| PROCESS STEPS | DEP RATE [Å/MIN] | TIME [SEC] | THICKNESS [Å] | CHAMBER ACCUMULATION [Å] | DEFECT ADDERS |
|---|---|---|---|---|---|
| TEOS PRECOAT | 5849 | 180 | 17547 | 17547 | N/A |
| TEOS DEP B1 | 6200 | 97.13 | 10037 | 27584 | NM |
| TEOS DEP B2 | 6200 | 97.13 | 10037 | 37621 | 10 |
| TEOS DEP B3 | 6200 | 97.13 | 10037 | 47658 | 6 |
| TEOS DEP B4 | 6200 | 97.13 | 10037 | 57695 | 13 |
| USG PRECOAT | 2919 | 415 | 20190 | 77885 | N/A |
| TEOS DEP B5 | 6200 | 97.13 | 10037 | 87922 | 12 |
| TEOS DEP B6 | 6200 | 97.13 | 10037 | 97959 | 17 |
| TEOS DEP B7 | 6200 | 97.13 | 10037 | 107996 | 10 |
| TEOS DEP B8 | 6200 | 97.13 | 10037 | 118033 | 17 |
| USG PRECOAT | 2919 | 415 | 20190 | 138223 | N/A |
| TEOS DEP B9 | 6200 | 97.13 | 10037 | 148260 | 43 |
| TEOS DEP B10 | 6200 | 97.13 | 10037 | 158297 | 26 |
| TEOS DEP B11 | 6200 | 97.13 | 10037 | 168334 | 23 |
| TEOS DEP B12 | 6201 | 97.13 | 10038 | 178372 | 66 |
| USG PRECOAT | 2919 | 415 | 20190 | 198562 | N/A |
| TEOS DEP B13 | 6201 | 97.13 | 10037 | 208599 | 47 |
| TEOS DEP B14 | 6201 | 97.13 | 10037 | 218636 | 64 |
| TEOS DEP B15 | 6201 | 97.13 | 10037 | 228673 | 99 |
| TEOS DEP B16 | 6201 | 97.13 | 10038 | 238711 | 169 |

TABLE VI

| CHAMBER ACCUMULATION [Å] | — | 37621 | 47658 | 57695 |
|---|---|---|---|---|
| DEFECT ADDERS [AT ≥0.09 μm] | NM | 10 | 6 | 13 |
| CHAMBER ACCUMULATION [Å] | 87922 | 97959 | 107996 | 118033 |
| DEFECT ADDERS [AT ≥0.09 μm] | 12 | 17 | 10 | 17 |
| CHAMBER ACCUMULATION [Å] | 148260 | 158297 | 168344 | 178372 |
| DEFECT ADDERS [AT ≥0.09 μm] | 43 | 26 | 23 | 66 |
| CHAMBER ACCUMULATION [Å] | 208599 | 218636 | 228673 | 238711 |
| DEFECT ADDERS [AT ≥0.09 μm] | 47 | 64 | 99 | 169 |

With reference now to FIGS. 3A through 3D, graphs of an accumulation limit of a silane ($SiH_4$)-based, undoped-silicate glass (USG) film and a resulting substrate-to-substrate thickness and average stress level after applying USG-passivation techniques disclosed herein are shown. The graphs are based on an approximately 4.85 μm (48,500 Angstroms (Å)) high-deposition rate $SiO_2$ film formed sequentially over a series of substrate (e.g., wafers). A thickness of a final accumulation of the film within the process chamber was approximately 40 μm (40,000 Å).

Figure 3A:
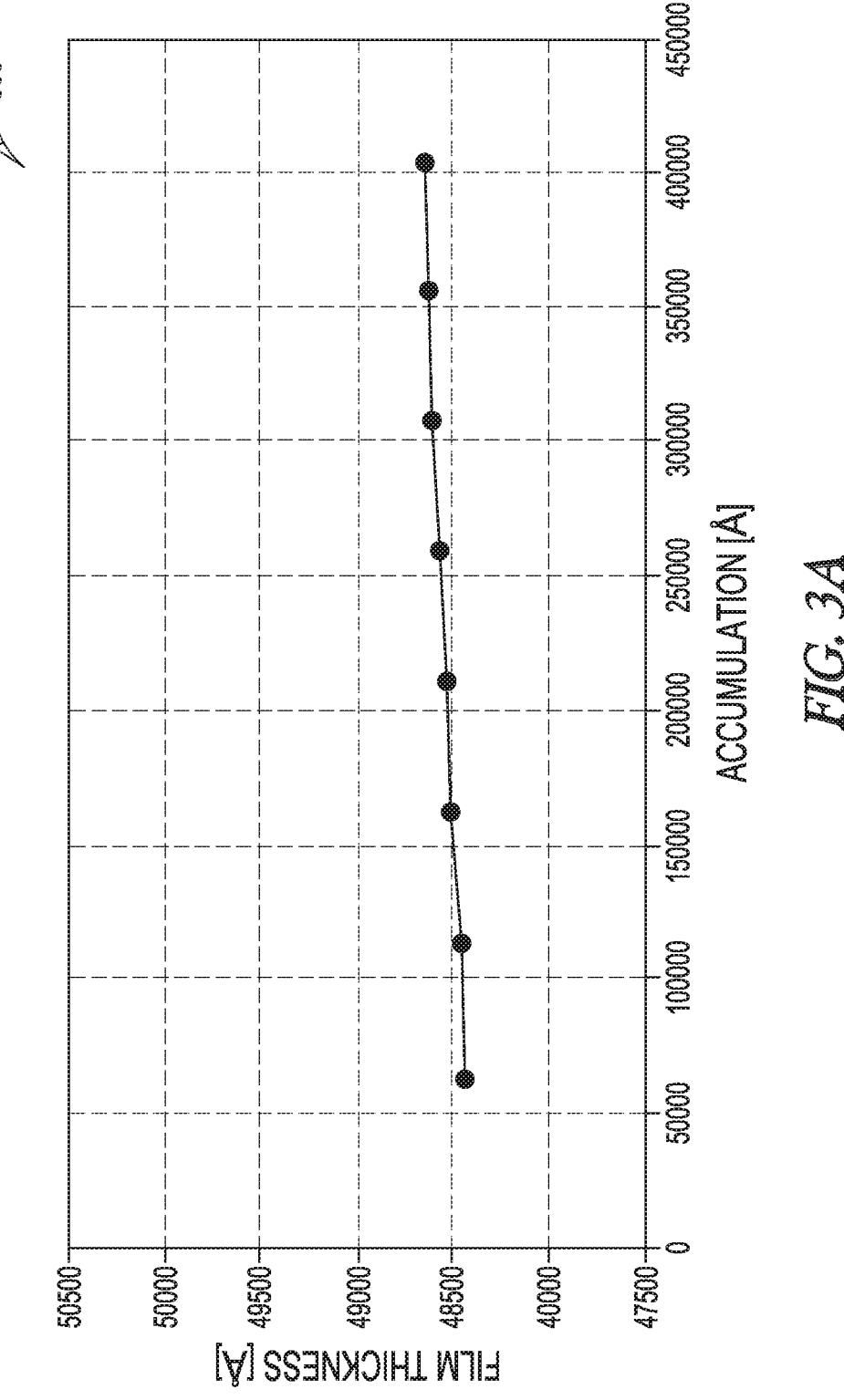
FIGS. 3A through 3D show graphs of an accumulation limit of a silane ($SiH_4$)-based, undoped-silicate glass (USG) film and a resulting substrate-to-substrate thickness and average stress level after applying USG passivation (encapsulation) techniques disclosed herein.
Figure 3B:
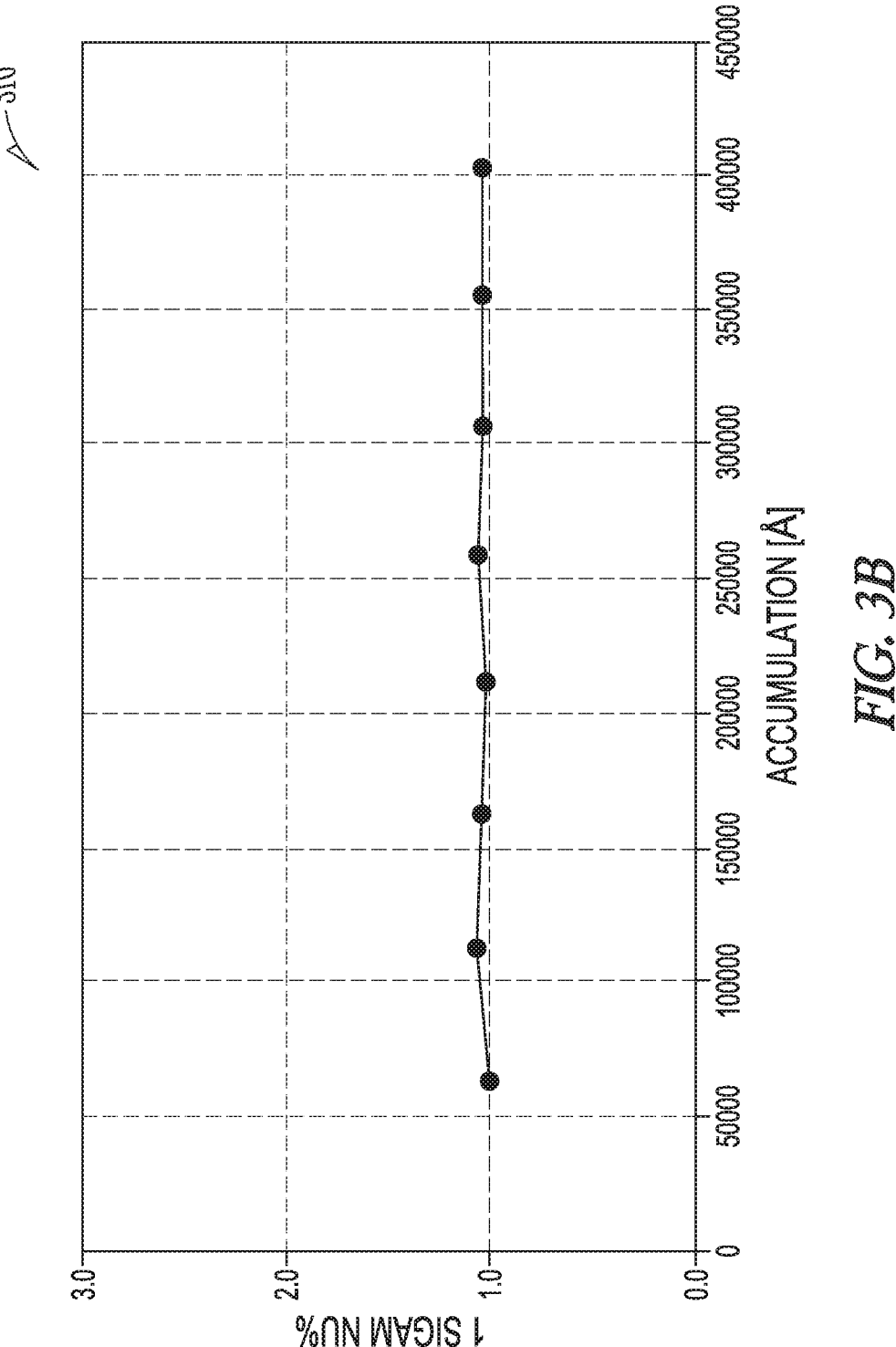
Figure 3C:
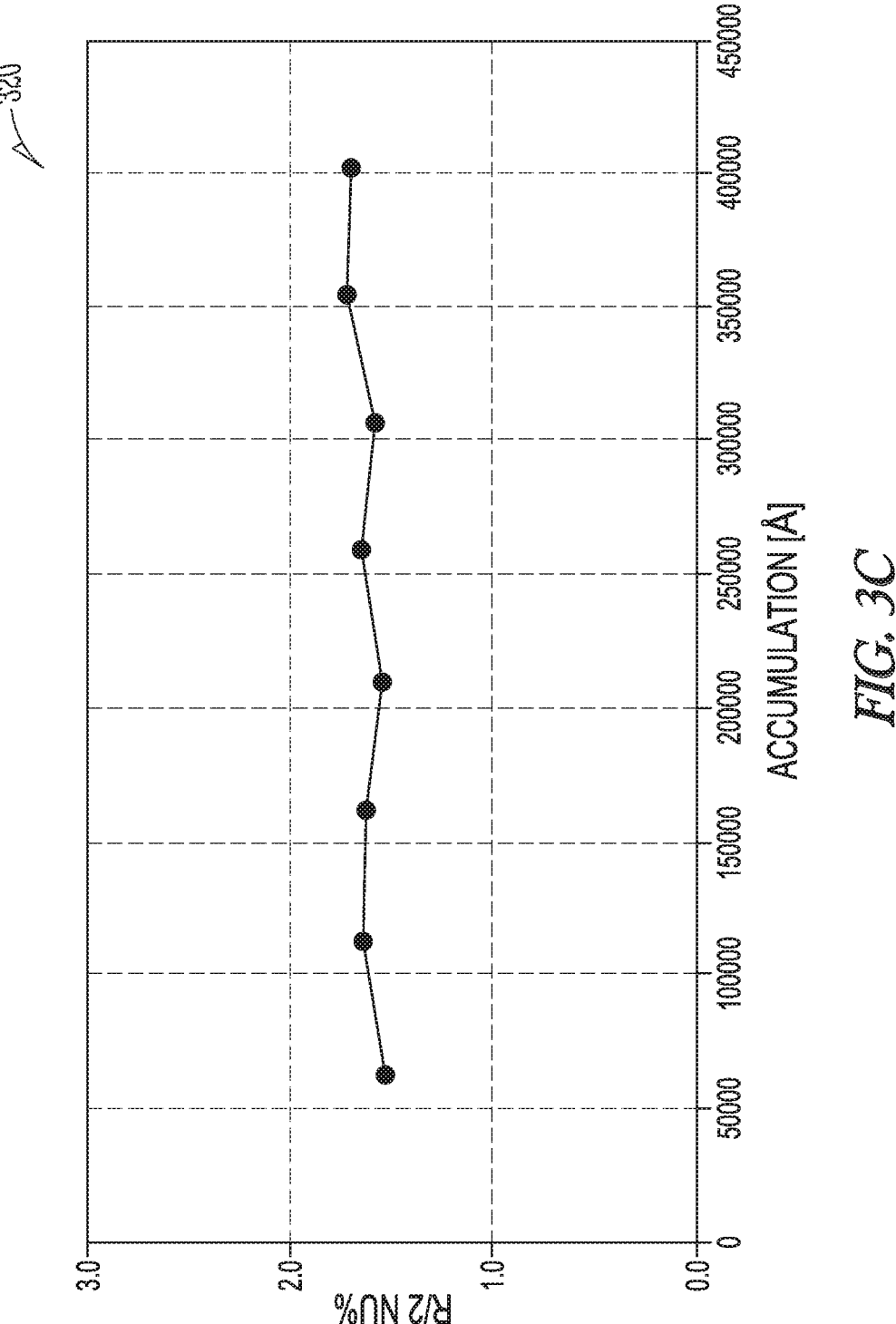
Figure 3D:
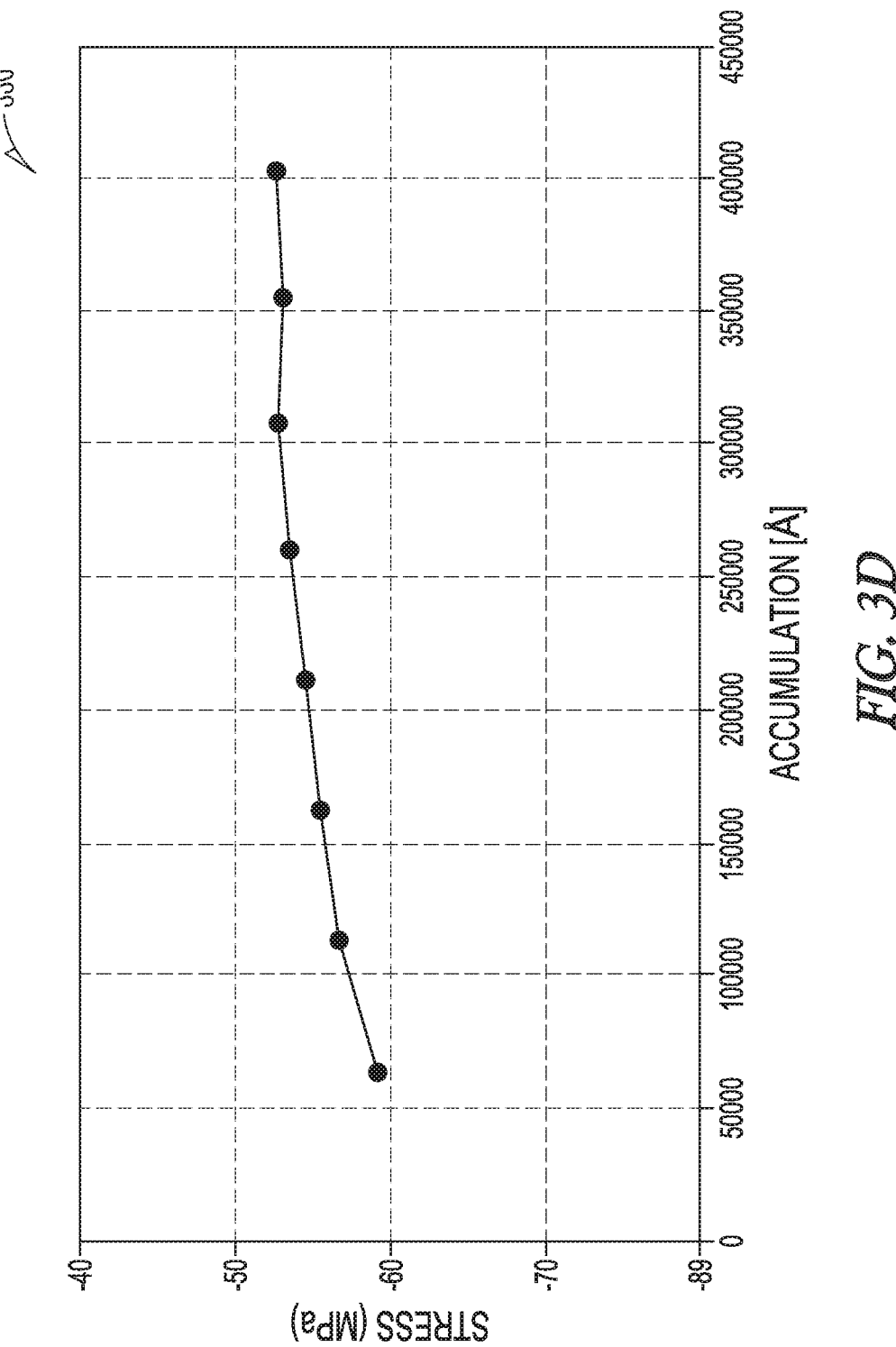

A first graph 300 in FIG. 3A shows film thickness variation, substrate-to-substrate, in Å, as a function of film thickness, in Å, accumulated within the process chamber. A one-sigma variation in film thickness, substrate-to-substrate, as indicated by the first graph 300 is about 0.15%.

A second graph 310 shows a one-sigma non-uniformity (NU), as a percentage, as a function of film thickness, in Å, accumulated within the process chamber. Each of the series of substrate film thicknesses shown indicates a one-sigma non-uniformity of approximately 1%. Therefore, for example, for a deposition thickness of 48,500 Å (4.85 μm), the one-sigma non-uniformity of the film is only about 485 Å (0.0485 μm or 48.5 nm).

A third graph 330 shows substrate bow, R, due to a compressively-stressed film formed on a series of substrates. The film causes a free-standing substrate to curve into a spherical shape, indicating the substrate is bowed. The bow is expressed as a non-uniformity percentage of R/2 as a function of film thickness, in Å, accumulated within the process chamber. An average value of R/2 non-uniformity is approximately 1.64%.

A fourth graph 330 shows compressive stress on a series of substrates due to the added film (as noted above, of approximately 4.85 μm in thickness) in units of force per unit area (specifically, in mega-Pascal (MPa)) as a function of film thickness, in Å, accumulated within the process chamber. Although the compressive stress is shown to have a trend on gradually declining with increasing film thickness levels accumulated within the process chamber, an average stress level, substrate-to-substrate, is approximately −55 MPa.

Therefore, as indicated by the graphs of FIGS. 3A through 3D, film properties deposited on the substrate remained substantially stable over the 40 μm film accumulation limit.

With reference now to FIGS. 4A through 4D, graphs of an accumulation limit of a silane ($SiH_4$)-based oxide films and a resulting substrate-to-substrate thickness and average particle-adders after applying USG-passivation techniques disclosed herein are shown. The graphs are based on an approximately 2.5 μm (2,500 Angstroms (Å)) high-deposition rate $SiO_2$ film formed sequentially over a series of substrate (e.g., wafers). A thickness of a final accumulation of the film within the process chamber was over 40 μm (40,000 Å).

Figure 4A:
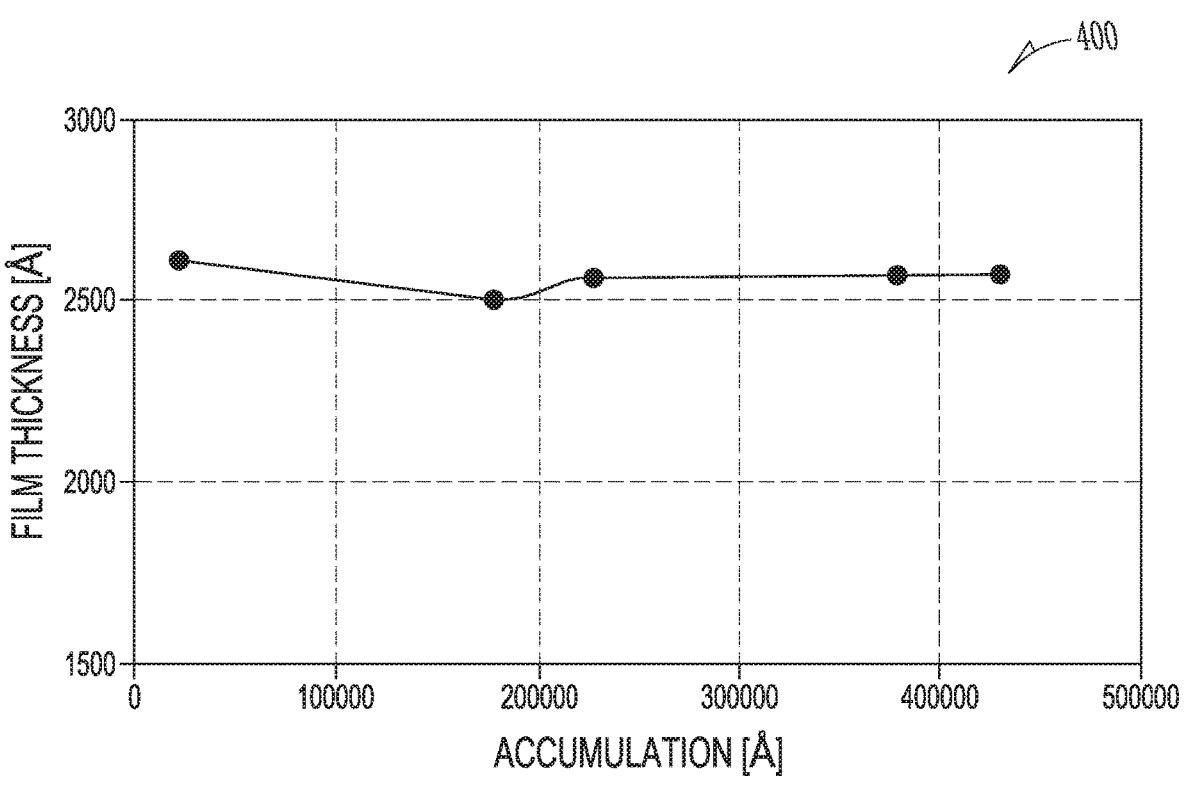
FIGS. 4A through 4) show graphs of an accumulation limit of a silane ($SiH_4$)-based oxide films and a resulting substrate-to-substrate thickness and average particle-adders after applying USG passivation (encapsulation) techniques disclosed herein.

A first graph 400 in FIG. 4A shows film thickness variation, substrate-to-substrate, in Å, as a function of film thickness, in Å, accumulated within the process chamber. A one-sigma variation in film thickness, substrate-to-substrate, as indicated by the first graph 400 is about 1.55%.

Figure 4B:
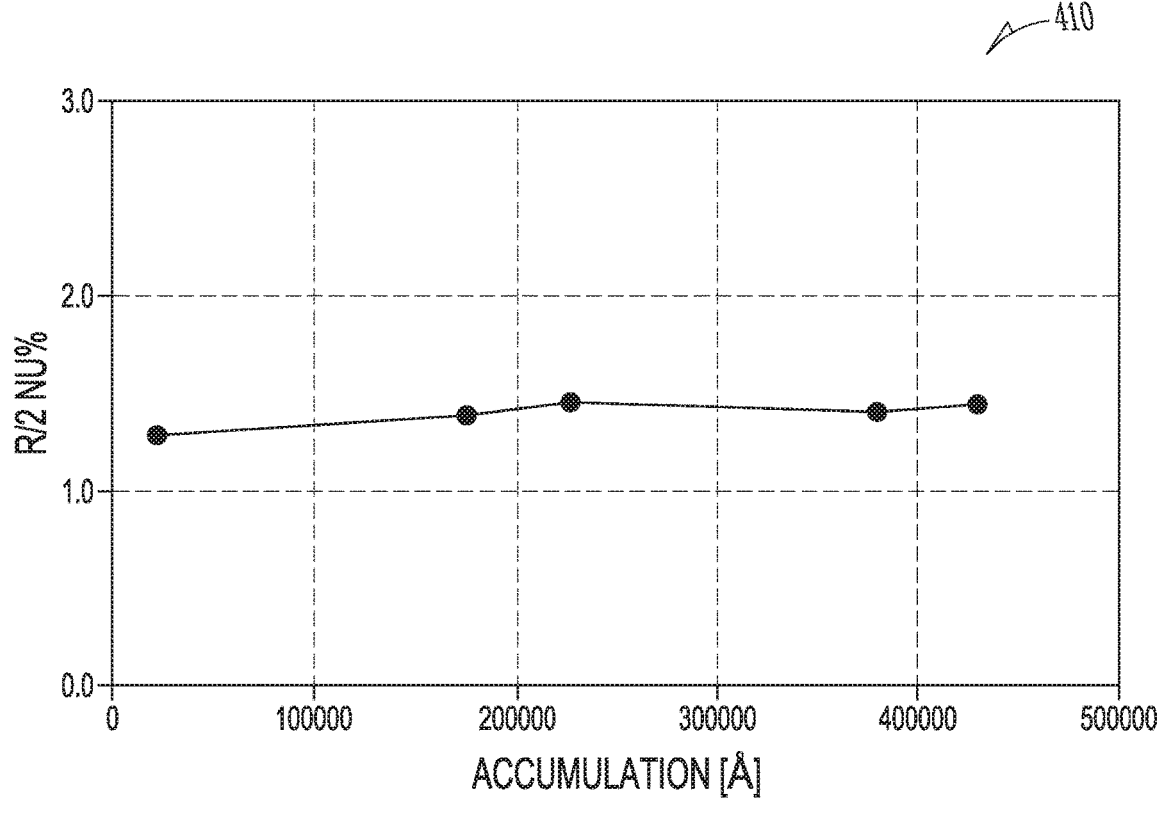

A second graph 410 in FIG. 4B shows substrate bow, R, due to a compressively-stressed film. The film causes a free-standing substrate to curve into a spherical shape, indicating the substrate is bowed. The bow is expressed as a non-uniformity percentage of R/2 as a function of film thickness, in Å, accumulated within the process chamber. An average value of R/2 non-uniformity is approximately 1.40%.

Figure 4C:
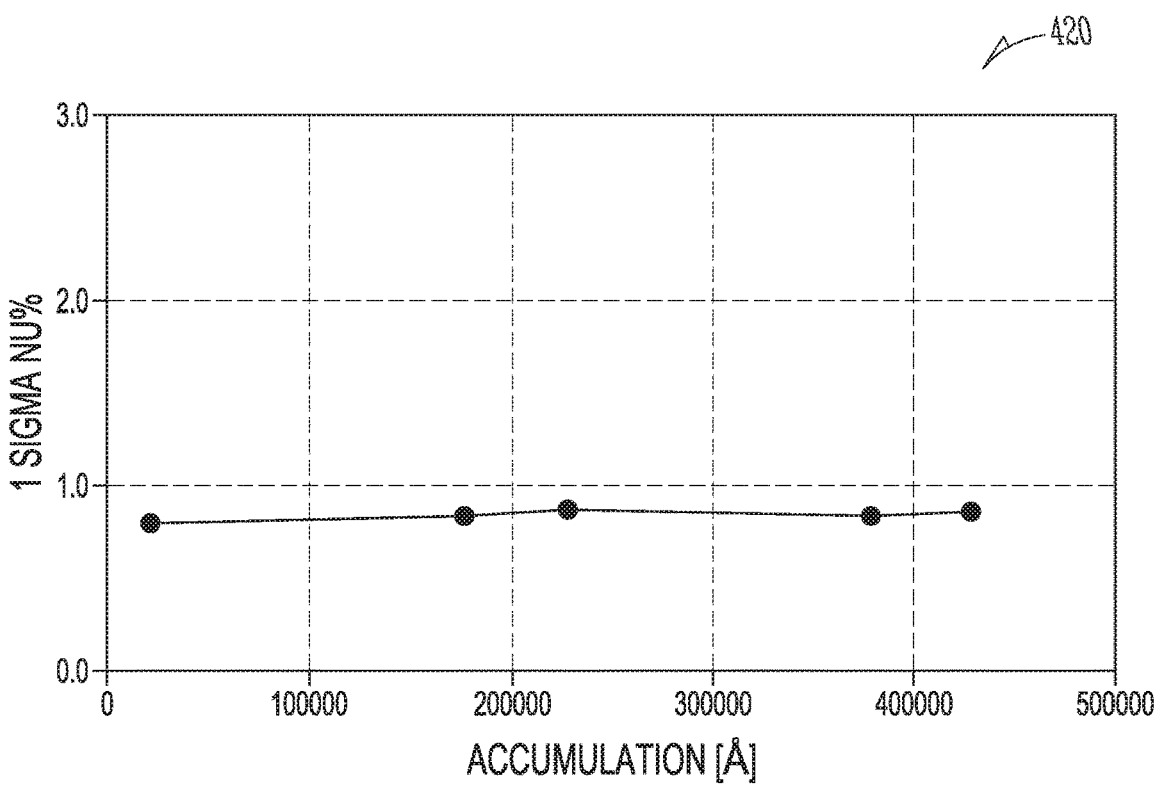

A third graph 420 in FIG. 4C shows a one-sigma non-uniformity (NU), as a percentage, as a function of film thickness, in A, accumulated within the process chamber. Each of the series of substrates shown indicates a one-sigma non-uniformity of approximately 0.83%. Therefore, for example, for a deposition thickness of 2,500 Å (250 μm), the one-sigma non-uniformity of the film is only about 20.75 Å (207.5 nm).

Figure 4D:
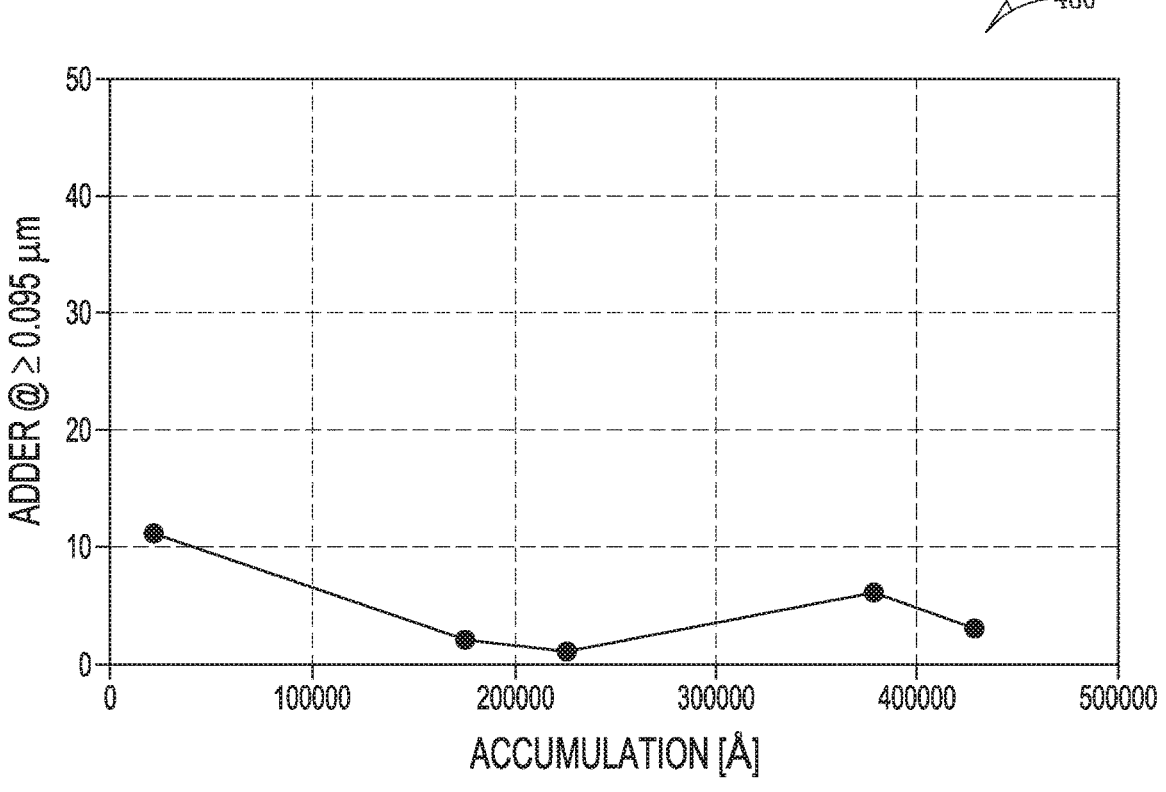

A fourth graph 430 in FIG. 4D shows defect adders as a function of film thickness, in Å, accumulated within the process chamber. The defect adders are measured at a sensitivity level of greater than or equal to 0.095 μm. The defects are monitored at low-level, medium-level, and highlevel accumulations of film within the process chamber. The average number of defect adders at greater than or equal to 0.095 μm is 4.6.

Therefore, as indicated by the graphs of FIGS. 4A through 4D, $SiH_4$-based oxide film properties deposited on the substrate remained substantially stable over the 40 μm film accumulation limit. The stability occurred without resorting to RFTC showerheads as described above. Additional tests (not shown) have indicated that the film properties deposited on the substrate remained stable over a 60 μm film accumulation limit.

Figure 5:
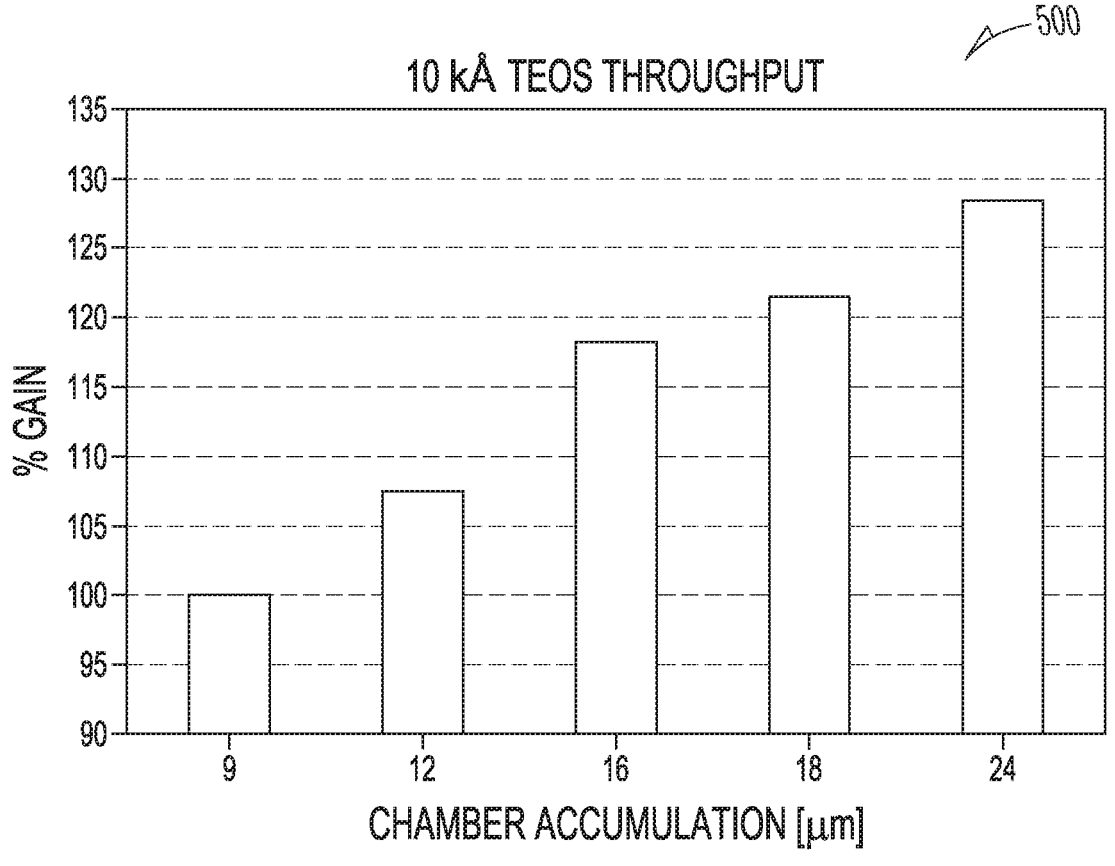
FIG. 5 shows a graph of a 10,000 Å throughput gain as a function of chamber accumulation, with a thickness of the accumulated film being measured in micrometers [μm]

As noted above, various types of defect-adder as a function of accumulation-limit tests were run to determine what a thickness of an accumulation limit may be, using the USG-based passivation-layer at one or more points in the film-deposition sequences described above. FIG. 5 shows a graph 500 of a 10,000 Å TEOS throughput gain, displayed as a percentage on the ordinate axis, as a function of chamber accumulation, with a thickness of the accumulated film being measured in micrometers [μm]. The tests run and described herein have shown that a 20% to 30% throughput improvement increase can be realized by increasing the thickness of the accumulation for about 9 μm to about 24 μm. Therefore, even though additional time is required to add a USG-deposition process step to passivate (e.g., encapsulate) films deposited within the process chamber (including on the showerhead), the additional time still increases the throughput significantly as compared with performing full process-chamber plasma-based cleaning steps after approximately 9 μm as was needed under the prior art. The plasma clean was needed to reset conditions of the chamber to a baseline state to ensure good repeatability of film properties on substrate, from batch-to-batch. By incorporating the added USG-deposition step or steps, a significant increase in substrate throughput can be realized.

Figure 6A:
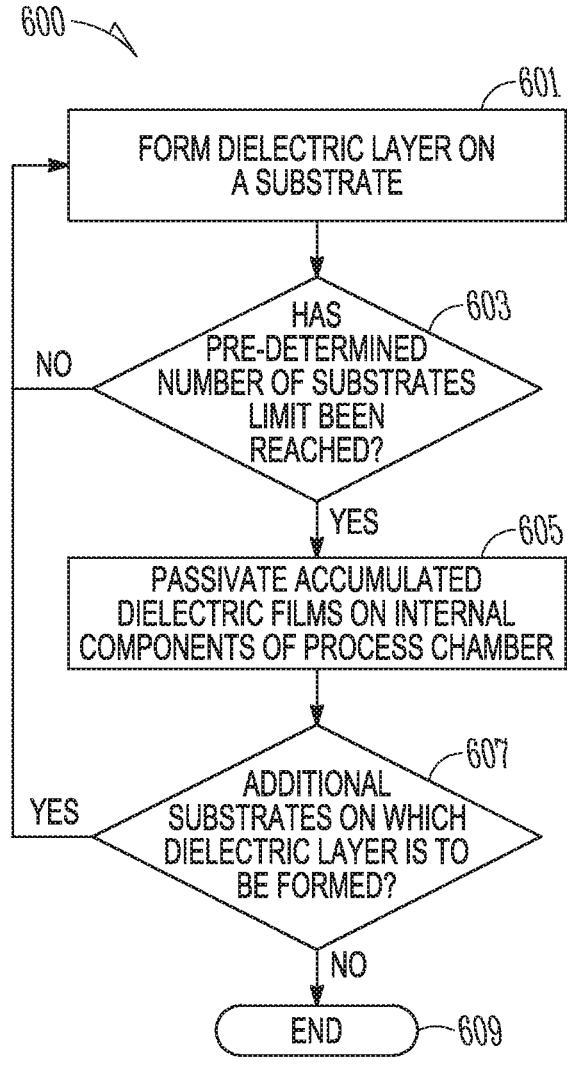
FIG. 6A shows an exemplary method for reducing film shedding from components internal to a process chamber based on a pre-determined number of substrates being processed, in accordance with the disclosed subject matter.

FIG. 6A shows an exemplary method 600 for reducing film shedding from components internal to a process chamber based on a pre-determined number of substrates being processed, in accordance with the disclosed subject matter. At operation 601, a dielectric layer is formed on a substrate. The dielectric layer and the thickness of the layer can comprise any number of material types and thicknesses.

At operation 603, a determination is made as to whether a pre-determined number of substrates having a layer formed thereon has been reached. A value of the pre-determined number of substrates may be based on a number of factors understandable to a skilled artisan upon reading and understanding the disclosed subject matter including, for example, a material used to form the dielectric layer and a thickness of the dielectric layer. For example, as the thickness of the dielectric layer increases, the total number of substrates that may be formed prior to film shedding from interior components within the process chamber is reduced. As the thickness of the dielectric layer deposited on each substrate increases, the thickness of the dielectric layer formed on the interior components of the process chamber increases commensurately. Therefore, as the thickness of the dielectric layer increases, there is a corresponding decrease in the number of substrates that can be processed before the interior components of the chamber may need to be passivated. Therefore, if the pre-determined number of substrates limit has been reached at operation 603, the exemplary method 600 continues to operation 605. If the pre-determined number of substrates limit has not been reached at operation 603, the exemplary method 600 returns to operation 601 to form a dielectric layer on an additional substrate.

At operation 605, after the pre-determined number of substrates limit has been reached at operation 603, the accumulated dielectric films formed on the interior components of the process chamber are passivated in accordance with various embodiments of the disclosed subject matter.

At operation 607, a determination is made whether there are additional substrates on which a dielectric layer is to be formed. If there are additional substrates on which a dielectric layer is to be formed, the exemplary method 600 returns to operation 601. If there are no additional substrates on which a dielectric layer is to be formed, the exemplary method 600 ends at operation 609.

Figure 6B:
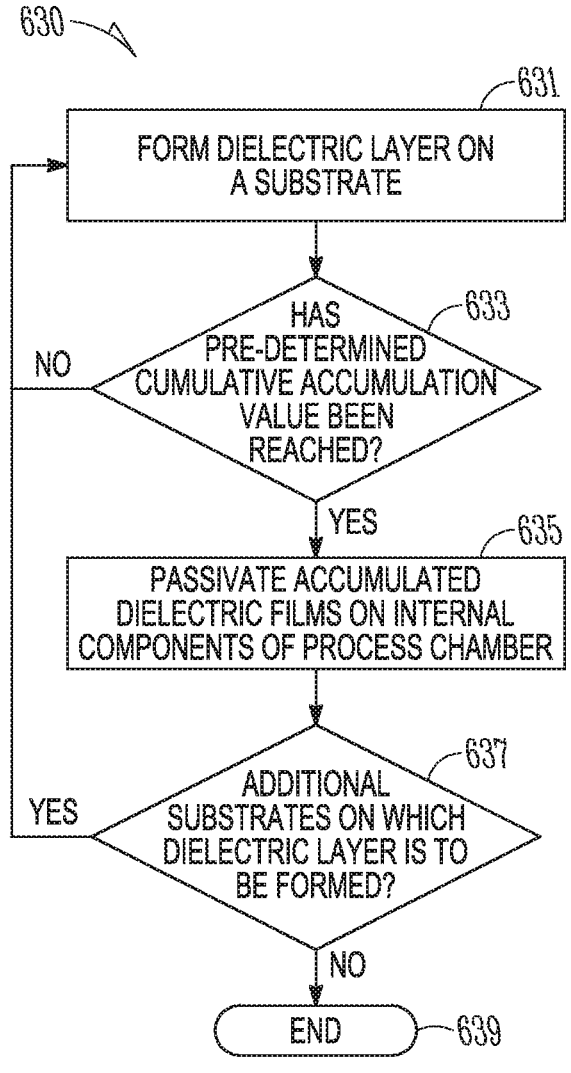
FIG. 6B shows an exemplary method for reducing film shedding from components internal to a process chamber based on a pre-determined cumulative accumulation value of the dielectric film layer being reached, in accordance with the disclosed subject matter.

FIG. 6B shows an exemplary method 630 for reducing film shedding from components internal to a process chamber based on a pre-determined cumulative accumulation value of the dielectric film layer being reached, in accordance with the disclosed subject matter. At operation 631, a dielectric layer is formed on a substrate. As discussed above with regard to FIG. 6A, the dielectric layer and the thickness of the layer can comprise any number of material types and thicknesses.

At operation 633, a determination is made as to whether a pre-determined cumulative accumulation value has been reached. The pre-determined cumulative accumulation value may be based on a number of factors understandable to a skilled artisan including, for example, a material used to form the dielectric layer and a thickness of each dielectric layer formed subsequent to the prior passivation. For example, as the thickness of the dielectric layer increases, the total number of substrates that may be processed prior to film shedding from interior components within the process chamber is reduced since the total cumulative accumulation value is reached more quickly (as compared with a thinner dielectric layer being formed). As the thickness of the dielectric layer deposited on each substrate increases, the thickness of the cumulative accumulation value of the dielectric layer formed on the interior components of the process chamber increases commensurately. Therefore, if the pre-determined cumulative accumulation value has been reached at operation 633, the exemplary method 630 continues to operation 635. If the pre-determined cumulative accumulation value has not been reached at operation 633, the exemplary method 630 returns to operation 631 to form a dielectric layer on an additional substrate.

At operation 635, after the pre-determined cumulative accumulation value has been reached at operation 633, the accumulated dielectric films formed on the interior components of the process may be passivated in accordance with various embodiments of the disclosed subject matter.

At operation 637, a determination is made whether there are additional substrates on which a dielectric layer is to be formed. If there are additional substrates on which a dielectric layer is to be formed, the exemplary method 630 returns to operation 631. If there are no additional substrates on which a dielectric layer is to be formed, the exemplary method 630 ends at operation 639.

Machines With Instructions to Perform Various Operations

Figure 7:
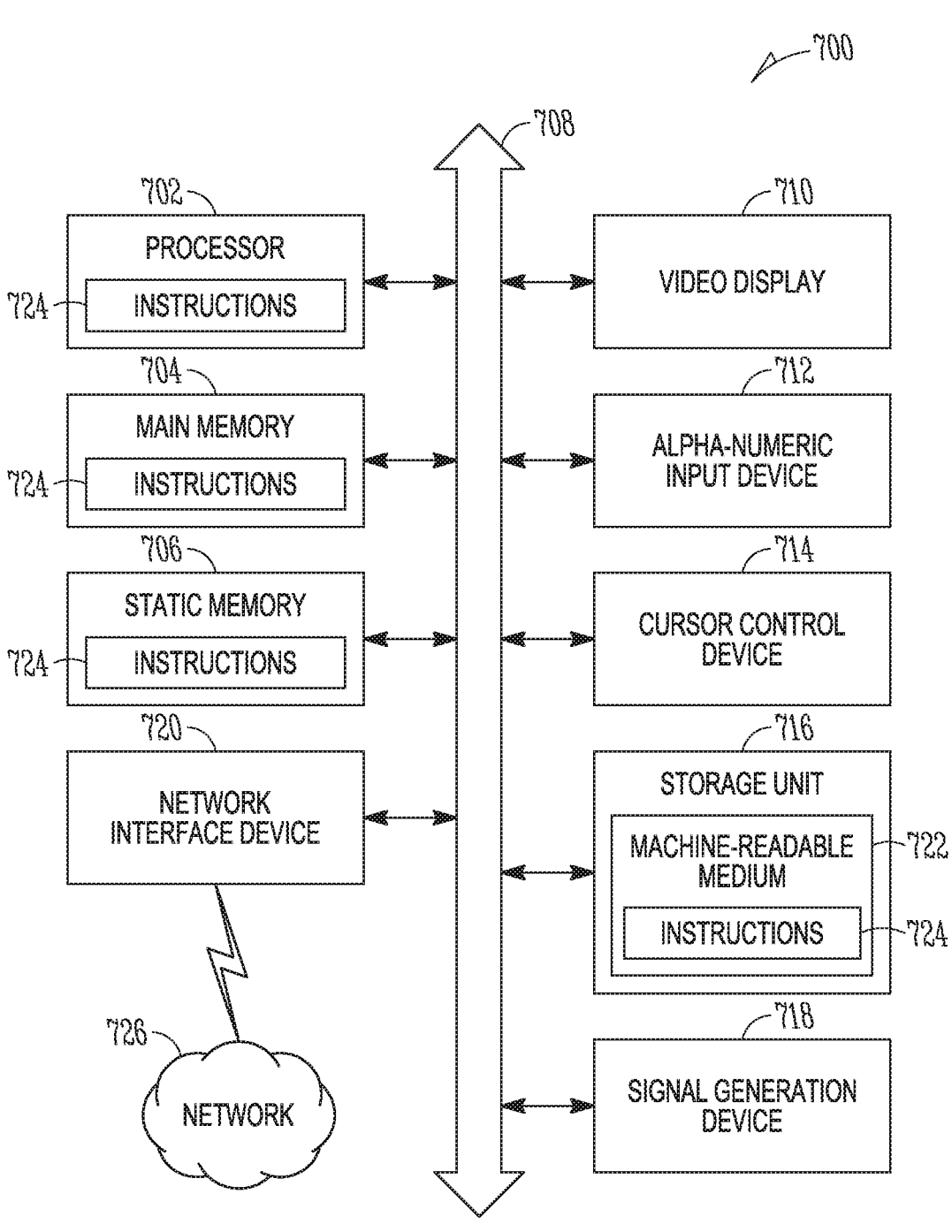
FIG. 7 shows a simplified block diagram of a machine in an example form of a computing system within which a set of instructions for causing the machine to perform any one or more of the methodologies and operations (e.g., process recipes) discussed herein may be executed.

FIG. 7 is a block diagram illustrating components of a machine 700, according to some embodiments, able to read instructions from a machine-readable medium e.g., a non-transitory machine-readable medium, a machine-readable storage medium, a computer-readable storage medium, or any suitable combination thereof) and perform any one or more of the methodologies discussed herein. Specifically, FIG. 7 shows a diagrammatic representation of the machine 700 in the example form of a computer system and within which instructions 724 (e.g., software, a program, an application, an applet, an app, or other executable code) for causing the machine 700 to perform any one or more of the methodologies discussed herein (e.g., a process recipe) may be executed.

In alternative embodiments, the machine 700 operates as a standalone device or may be connected (e.g., networked) to other machines. In a networked deployment, the machine 700 may operate in the capacity of a server machine or a client machine in a server-client network environment, or as a peer machine in a peer-to-peer (or distributed) network environment. The machine 700 may be a server computer, a client computer, a personal computer (PC), a tablet computer, a laptop computer, a netbook, a set-top box (STB), a personal digital assistant (PDA), a cellular telephone, a smartphone, a web appliance, a network router, a network switch, a network bridge, or any machine capable of executing the instructions 724, sequentially or otherwise, that specify actions to be taken by that machine. Further, while only a single machine is illustrated, the term "machine" shall also be taken to include a collection of machines that individually or jointly execute the instructions 724 to perform any one or more of the methodologies discussed herein.

The machine 700 includes a processor 702 (e.g., a central processing unit (CPU), a graphics processing unit (GPU), a digital signal processor (DSP), an application specific integrated circuit (ASIC), a radio-frequency integrated circuit (RFIC), or any suitable combination thereof), a main memory 704, and a static memory 706, which are configured to communicate with each other via a bus 708. The processor 702 may contain microcircuits that are configurable, temporarily or permanently, by some or all of the instructions 724 such that the processor 702 is configurable to perform any one or more of the methodologies described herein, in whole or in part. For example, a set of one or more microcircuits of the processor 702 may be configurable to execute one or more modules (e.g., software modules) described herein.

The machine 700 may further include a graphics display 710 (e.g., a plasma display panel (PDP), a light emitting diode (LED) display, a liquid crystal display (LCD), a projector, or a cathode ray tube (CRT)). The machine 700 may also include an alpha-numeric input device 712 (e.g., a keyboard), a cursor control device 714 (e.g., a mouse, a touchpad, a trackball, a joystick, a motion sensor, or other pointing instrument), a storage unit 716, a signal generation device 718 (e.g., a speaker), and a network interface device 720.

The storage unit 716 includes a machine-readable medium 722 (e.g., a tangible and/or non-transitory machine-readable storage medium) on which is stored the instructions 724 embodying any one or more of the methodologies or functions described herein. The instructions 724 may also reside, completely or at least partially, within the main memory 704, within the processor 702 (e.g., within the processor's cache memory), or both, during execution thereof by the machine 700. Accordingly, the main memory 704 and the processor 702 may be considered as machine-readable media (e.g., tangible and/or non-transitory machine-readable media). The instructions 724 may be transmitted or received over a network 726 via the network interface device 720. For example, the network interface device 720 may communicate the instructions 724 using any one or more transfer protocols (e.g., hypertext transfer protocol (HTTP)).

In some embodiments, the machine 700 may be a portable computing device, such as a smart phone or tablet computer, and have one or more additional input components (e.g., sensors or gauges). Examples of such additional input components include an image input component (e.g., one or more cameras), an audio input component (e.g., a microphone), a direction input component (e.g., a compass), a location input component (e.g., a global positioning system (GPS) receiver), an orientation component (e.g., a gyroscope), a motion detection component (e.g., one or more accelerometers), an altitude detection component (e.g., an altimeter), and a gas detection component (e.g., a gas sensor). Inputs harvested by any one or more of these input components may be accessible and available for use by any of the modules described herein.

As used herein, the term "memory" refers to a machine-readable medium able to store data temporarily or permanently and may be taken to include, but not be limited to, random-access memory (RAM), read-only memory (ROM), buffer memory, flash memory, and cache memory. While the machine-readable medium 722 is shown in an embodiment to be a single medium, the term "machine-readable medium" should be taken to include a single medium or multiple media (e.g., a centralized or distributed database, or associated caches and servers) able to store instructions. The term "machine-readable medium" shall also be taken to include any medium, or combination of multiple media, that is capable of storing instructions for execution by a machine (e.g., the machine 700), such that the instructions, when executed by one or more processors of the machine (e.g., the processor 702), cause the machine to perform any one or more of the methodologies described herein. Accordingly, a "machine-readable medium" refers to a single storage apparatus or device, as well as "cloud-based" storage systems or storage networks that include multiple storage apparatus or devices. The term "machine-readable medium" shall accordingly be taken to include, but not be limited to, one or more tangible (e.g., non-transitory) data repositories in the form of a solid-state memory, an optical medium, a magnetic medium, or any suitable combination thereof.

Furthermore, the machine-readable medium is non-transitory in that it does not embody a propagating signal. However, labeling the tangible machine-readable medium as "non-transitory" should not be construed to mean that the medium is incapable of movement—the medium should be considered as being transportable from one physical location to another. Additionally, since the machine-readable medium is tangible, the medium may be considered to be a machine-readable device.

The instructions 724 may further be transmitted or received over a network 726 (e.g., a communications network) using a transmission medium via the network interface device 720 and utilizing any one of a number of well-known transfer protocols (e.g., HTTP). Examples of communication networks include a local area network (LAN), a wide area network (WAN), the Internet, mobile telephone networks, POTS networks, and wireless data networks (e.g., WiFi and WiMAX networks). The term "transmission medium" shall be taken to include any intangible medium that is capable of storing, encoding, or carrying instructions for execution by the machine, and includes digital or analog communications signals or other intangible medium to facilitate communication of such software.

Overall, the disclosed subject matter contained herein describes or relates generally to depositing of otherwise forming uniform thickness layers of materials while passivating films deposited concurrently on internal process-chamber components (including showerheads). However, the disclosed subject matter is not limited to semiconductor fabrication environments and can be used in a number of other environments. Upon reading and understanding the disclosure provided herein, a person of ordinary skill in the art will recognize that various embodiments of the disclosed subject matter may be used with other types of process tools as well as a wide variety of other tools, equipment, and components.

As used herein, the term "or" may be construed in an inclusive or exclusive sense. Further, other embodiments will be understood by a person of ordinary skill in the art upon reading and understanding the disclosure provided. Further, upon reading and understanding the disclosure provided herein, the person of ordinary skill in the art will readily understand that various combinations of the techniques and examples provided herein may all be applied in various configurations.

Although various embodiments are discussed separately, these separate embodiments are not intended to be considered as independent techniques or designs. As indicated above, each of the various portions may be inter-related and each may be used separately or in combination with other embodiments discussed herein. For example, although various embodiments of methods, operations, and processes have been described, these methods, operations, and processes may be used either separately or in various combinations.

Consequently, many modifications and variations can be made, as will be apparent to a person of ordinary skill in the art upon reading and understanding the disclosure provided herein. Further, functionally equivalent methods and devices within the scope of the disclosure, in addition to those enumerated herein, will be apparent to the skilled artisan from the foregoing descriptions. Portions and features of some embodiments, materials, and construction techniques may be included in, or substituted for, those of others. Such modifications and variations are intended to fall within a scope of the appended claims. Therefore, the present disclosure is to be limited only by the terms of the appended claims, along with the full scope of equivalents to which such claims are entitled. It is also to be understood that the terminology used herein is for the purpose of describing particular embodiments only and is not intended to be limiting.

The Abstract of the Disclosure is provided to allow the reader to quickly ascertain the nature of the technical disclosure. The abstract is submitted with the understanding that it will not be used to interpret or limit the claims. In addition, in the foregoing Detailed Description, it may be seen that various features may be grouped together in a single embodiment for the purpose of streamlining the disclosure. This method of disclosure is not to be interpreted as limiting the claims. Thus, the following claims are hereby incorporated into the Detailed Description, with each claim standing on its own as a separate embodiment.

The Following Numbered Examples are Specific Embodiments of the Disclosed Subject Matter Example 1: An embodiment of the disclosed subject matter describes a method to reduce film shedding from components internal to a process chamber. The method includes forming a dielectric film layer on each of a successive plurality of substrates within the process chamber. After a pre-determined number of the successive plurality of substrates have had the dielectric film layers formed thereon, forming an undoped-silicate glass (USG) film on the components internal to the process chamber to passivate accumulated levels of the dielectric film layers.

Example 2: The method of example 1, wherein the pre-determined number of the successive plurality of substrates that have had the dielectric film layers formed thereon is based on a material used to form the dielectric film layer and a thickness of the dielectric film layer.

Example 3: The method of either Example 1 or Example 2, further including determining a cumulative accumulation of the dielectric film layer on each of the successive plurality of substrates.

Example 4: The method of any one of the preceding Examples, wherein the dielectric film layer is a silane ($SiH_4$)-based oxide film.

Example 5: The method of any one of the preceding Examples, wherein the USG film is configured to increase film adhesion to a showerhead face plate and to dielectric films layers deposited thereon.

Example 6: The method of any one of the preceding Examples, wherein the USG film provides a passivation encapsulation layer, to reduce particles from shedding off of the components internal to the process chamber.

Example 7: The method of any one of the preceding Examples, further including not employing a radio-frequency-powered, temperature-controlled (RFTC) showerhead.

Example 8: The method of any one of the preceding Examples, wherein an accumulation limit on the components internal to the process chamber is greater than about 12 μm.

Example 9: The method of any one of the preceding Examples, wherein an accumulation limit on the components internal to the process chamber is greater than about 40 μm.

Example 10: An embodiment of the disclosed subject matter describes a method for passivating accumulated films in a process chamber. The method includes forming a dielectric layer on a substrate and making a determination as to whether a pre-determined number of substrates to be processed has been reached. Based on a determination that the pre-determined number has not been reached, processing an additional substrate. Based on a determination that the pre-determined number has been reached, passivating the accumulated films on internal components of the process chamber.

Example 11: The method of Example 10, The method of claim 10, further including, after passivating the accumulated films on internal components of the process chamber, making a determination as to whether there are additional substrates on to which dielectric layers are to be formed on respective ones of the additional substrates. Based on a determination that there are additional substrates on to which dielectric layers are to be formed, forming a dielectric film layer on each of successive ones of the additional substrates within the process chamber. Based on a determination that there are no additional substrates on to which dielectric layers are to be formed, ending the method.

Example 12: The method of either of Examples 10 or Example 11, wherein passivating the accumulated films on internal components of the process chamber comprises forming an undoped-silicate glass (USG) film on the components internal to the process chamber.

Example 13: The method of any one of the preceding Examples 10 et seq., wherein the accumulated films comprise films formed from the dielectric layers formed on the substrates.

Example 14: The method of any one of the preceding Examples 10 et seq., further including determining a value of film adhesion to a showerhead face plate in the process chamber to at least partially determine the accumulation limit.

Example 15: The method of any one of the preceding Examples 10 et seq., wherein the passivation is based on forming a silane ($SiH_4$)-based, undoped-silicate glass (USG) passivation film on the internal components of the process chamber.

Example 16: The method of Example 15, wherein the silane-based, USG film is periodically inserted between selected ones of the dielectric layers sequentially-deposited onto the substrates.

Example 17: The method of Example 15, wherein the silane-based, USG film is used to form a multi-layer structure that adheres to the interior portions of the process chamber.

Example 18: The method of any one of the preceding Examples 10 et seq., wherein the dielectric layer comprises a silicon dioxide ($SiO_2$) film.

Example 19: An embodiment of the disclosed subject matter describes a tangible computer-readable medium having no transitory signals and containing instructions that, when executed by one or more hardware-based processors of a machine, cause the machine to perform operations including forming a dielectric layer on a substrate and making a determination as to whether a pre-determined number of substrates to be processed has been reached. Based on a determination that the pre-determined limit has not been reached, processing an additional substrate. Based on a determination that the pre-determined limit has been reached, passivating the accumulated films on internal components of the process chamber.

Example 20: The tangible computer-readable medium of Example 19, wherein passivating the accumulated films on internal components of the process chamber comprises forming an undoped-silicate glass (USG) film on the components internal to the process chamber.

Example 21: The tangible computer-readable medium of either Example 19 or Example 20, wherein the accumulated films comprise films formed from the dielectric layers formed on the substrates.

Example 22: The tangible computer-readable medium of any of the preceding examples 19 el seq., further including determining a value of film adhesion to a showerhead face plate in the process chamber to at least partially determine the accumulation limit.

Example 23: The tangible computer-readable medium of any of the preceding examples 19 el seq., wherein the passivation is based on forming a silane ($SiH_4$)-based, undoped-silicate glass (USG) passivation film on the internal components of the process chamber.

Example 24: An embodiment of the disclosed subject matter describes a method to reduce film shedding from components internal to a process chamber, the method includes forming a dielectric film layer on each of a successive plurality of substrates within the process chamber and making a determination as to whether a pre-determined cumulative accumulation value of the dielectric film layer on each of the successive plurality of substrates has at least been reached. Based on a determination that the pre-determined cumulative accumulation value has not been reached, processing an additional substrate. Based on a determination that the pre-determined the pre-determined cumulative accumulation value has at least been reached, passivating the accumulated films on internal components of the process chamber.

Example 25. The method of Example 24, further including, after a pre-determined number of the successive plurality of substrates have had the dielectric film layers formed thereon, forming an undoped-silicate glass (USG) film on the components internal to the process chamber to passivate accumulated levels of the dielectric film layers.

Example 26: The method of either Example 24 or Example 25, further including determining a cumulative accumulation of the dielectric film layer on each of the successive plurality of substrates.

Example 27: The tangible computer-readable medium of any of the preceding examples 24 et seq., further including determining a cumulative accumulation of the dielectric film layer on each of the successive plurality of substrates.

Example 28: An embodiment of the disclosed subject matter describes a tangible computer-readable medium having no transitory signals and containing instructions that, when executed by one or more hardware-based processors of a machine, cause the machine to perform operations including forming a dielectric film layer on each of a successive plurality of substrates within the process chamber and making a determination as to whether a pre-determined cumulative accumulation value of the dielectric film layer on each of the successive plurality of substrates has at least been reached. Based on a determination that the pre-determined cumulative accumulation value has not been reached, processing an additional substrate. Based on a determination that the pre-determined the pre-determined cumulative accumulation value has at least been reached, passivating the accumulated films on internal components of the process chamber.

Example 29: The tangible computer-readable medium of Example 28, wherein passivating the accumulated films on internal components of the process chamber comprises forming an undoped-silicate glass (USG) film on the components internal to the process chamber.

Example 30: The tangible computer-readable medium of either of Example 28 or Example 29, wherein the accumulated films comprise films formed from the dielectric layers formed on the substrates.

What is claimed is:

1. A method to reduce film shedding from components internal to a process chamber, the method comprising:
  forming a dielectric film layer on successive substrates of a plurality of substrates within the process chamber;
  after forming the dielectric film layer on the successive substrates of the plurality of substrates, making a determination as to whether a pre-determined number of the plurality of substrates have had the dielectric film layers formed thereon, the pre-determined number of the plurality of substrates that have had the dielectric film layers formed thereon being based on both a material used to form the dielectric film layer and a thickness of the dielectric film layer, and the pre-determined number being determined by measuring a cumulative thickness of dielectric film accumulated on the components internal to the process chamber;
  based on a determination that the pre-determined number of the plurality of substrates have had the dielectric film layers formed thereon, forming an undoped-silicate glass (USG) barrier film on the components internal to the process chamber to passivate accumulated levels of the dielectric film layers; and based on a determination that the pre-determined number of the plurality of substrates have not had the dielectric film layers formed thereon, forming a dielectric film layer on a subsequent one of the plurality of substrates.

2. The method of claim 1, further comprising determining a cumulative accumulation of the dielectric film layer on each of the successive plurality of substrates.

3. The method of claim 1, wherein the dielectric film layer is a silane ($SiH_4$)-based oxide film.

4. The method of claim 1, wherein the USG barrier film is configured to increase film adhesion to a showerhead face plate and to dielectric film layers deposited thereon, the USG barrier film being formed at a higher process temperature than the forming of the dielectric film layer, thereby creating a more compressive film, the more compressive film being configured to increase film adhesion to a showerhead face plate and to the dielectric film layers deposited thereon.

5. The method of claim 1, wherein the USG barrier film provides a passivation encapsulation layer, to reduce particles from shedding off of the components internal to the process chamber.

6. The method of claim 1, further comprising not employing a radio-frequency-powered, temperature-controlled (RFTC) showerhead.

7. The method of claim 1, wherein an accumulation limit on the components internal to the process chamber is greater than about 12 µm.

8. The method of claim 1, wherein an accumulation limit on the components internal to the process chamber is greater than about 40 µm.

9. A method for passivating accumulated films and reducing film shedding in a process chamber, the method comprising:
  forming a dielectric film layer on successive substrates of a plurality of substrates within the process chamber;
  making a determination as to whether a pre-determined number of substrates to be processed has been reached, the pre-determined number of the number of substrates that have had the dielectric film layers formed thereon being based on both a material used to form the dielectric film layer and a thickness of the dielectric film layer, and the pre-determined number being determined by measuring a cumulative thickness of dielectric film accumulated on internal components of the process chamber;
  based on a determination that the pre-determined number has not been reached based on both the material used to form the dielectric film layer and the thickness of the dielectric film layer, processing an additional one of the plurality of substrates; and
  based on a determination that the pre-determined number has been reached based on both the material used to form the dielectric film layer and the thickness of the dielectric film layer, passivating the accumulated films on the internal components of the process chamber to reduce the film shedding.

10. The method of claim 9, further comprising, after passivating the accumulated films on the internal components of the process chamber, making a determination as to whether there are additional substrates on which dielectric layers are to be formed on respective ones of the additional substrates; and
  based on a determination that there are additional substrates on to-which dielectric layers are to be formed, forming a dielectric film layer on each of successive ones of the additional substrates within the process chamber; and based on a determination that there are no additional substrates on to-which dielectric layers are to be formed, ending the method.

11. The method of claim 9, wherein passivating the accumulated films on the internal components of the process chamber comprises forming an undoped-silicate glass (USG) barrier film on the internal components of the process chamber.

12. The method of claim 9, wherein the accumulated films comprise films formed from the dielectric layers formed on the substrates.

13. The method of claim 9, further comprising determining a value of film adhesion to a showerhead face plate in the process chamber to at least partially determine an accumulation limit.

14. The method of claim 9, wherein the passivation is based on forming a silane (SiH$_4$)-based undoped-silicate glass (USG) passivation barrier film on the internal components of the process chamber.

15. The method of claim 14, wherein the silane-based USG passivation barrier film is periodically inserted between selected ones of the dielectric layers sequentially deposited onto the substrates.

16. The method of claim 14, wherein the silane-based USG passivation barrier film is used to form a multi-layer structure that adheres to the internal components of the process chamber.

17. The method of claim 9, wherein the dielectric layer comprises a silicon dioxide (SiO$_2$) film.

18. A method to reduce film shedding from components internal to a process chamber, the method comprising:

forming a dielectric film layer on successive substrates of a plurality of substrates within the process chamber;

making a determination as to whether a pre-determined cumulative accumulation value of the dielectric film layer on each of the plurality of substrates on which a dielectric layer has been formed has at least been reached, the pre-determined cumulative accumulation value of the dielectric film layer on each of the plurality of substrates that have had the dielectric film layers formed thereon being based both on a material used to form the dielectric film layer and a thickness of the dielectric film layer, and the pre-determined cumulative accumulation value being determined by measuring a cumulative thickness of dielectric film accumulated on the components internal to the process chamber;

based on a determination that the pre-determined cumulative accumulation value has not been reached based on both the material used to form the dielectric film layer and the thickness of the dielectric film layer, processing an additional substrate; and based on a determination that the pre-determined cumulative accumulation value has at least been reached based on both the material used to form the dielectric film layer and the thickness of the dielectric film layer, passivating accumulated films on the components internal to the process chamber.

19. The method of claim 18, further comprising after a pre-determined number of the plurality of substrates have had the dielectric film layers formed thereon, forming an undoped-silicate glass (USG) barrier film on the components internal to the process chamber to passivate accumulated levels of the dielectric film layers.

20. The method of claim 18, further comprising determining a cumulative accumulation of the dielectric film layer on each of the plurality of substrates.

21. The method of claim 18, further comprising determining a cumulative accumulation of the dielectric film layer on each of the plurality of substrates.

* * * * *